US006808864B2

(12) United States Patent
Sawada et al.

(10) Patent No.: US 6,808,864 B2
(45) Date of Patent: Oct. 26, 2004

(54) SUPPORT FOR LITHOGRAPHIC PRINTING PLATE AND PRESENSITIZED PLATE

(75) Inventors: Hirokazu Sawada, Shizuoka (JP); Akio Uesugi, Shizuoka (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 0 days.

(21) Appl. No.: 10/237,884

(22) Filed: Sep. 10, 2002

(65) Prior Publication Data

US 2003/0124364 A1 Jul. 3, 2003

(30) Foreign Application Priority Data

Sep. 12, 2001 (JP) ....................................... 2001-276265
Sep. 28, 2001 (JP) ....................................... 2001-304628

(51) Int. Cl.$^7$ .......................... G03F 7/085; B41N 1/00; C22C 21/08; C22C 21/16; C22C 21/06

(52) U.S. Cl. ................................ 430/277.1; 430/278.1; 148/437; 148/438; 148/439; 148/440; 101/459; 420/533; 420/534; 420/535; 420/536; 420/542; 420/543; 420/544; 420/547; 420/553; 420/554; 428/472.2; 428/650

(58) Field of Search ................................ 420/533–536, 420/542–544, 547, 553, 554; 430/277.1, 278.1; 101/459; 148/437–440; 428/472.2, 650

(56) References Cited

U.S. PATENT DOCUMENTS

| | | | |
|---|---|---|---|
| 3,475,167 A | * 10/1969 | Beatty et al. |
| 4,822,715 A | 4/1989 | Shoji et al. |
| 4,939,044 A | 7/1990 | Ohashi et al. |
| 5,104,743 A | 4/1992 | Nishikawa et al. |
| 5,779,824 A | * 7/1998 | Sawada et al. |
| 6,638,686 B2 | * 10/2003 | Sawada et al. |

FOREIGN PATENT DOCUMENTS

| | | |
|---|---|---|
| EP | 0 652 298 A1 | 5/1995 |
| EP | 0 695 647 A1 | 2/1996 |
| EP | 1 106 381 A1 | 6/2001 |
| JP | 58-001048 A | 1/1983 |
| JP | 59-220395 A | 12/1984 |
| JP | 59-220396 A | 12/1984 |
| JP | 06-324477 A | 11/1994 |
| JP | 11-115333 A | 4/1999 |
| JP | 2001162958 | 6/2001 |
| JP | 2003-082426 | * 3/2003 |

OTHER PUBLICATIONS

Derwent Abstr. No. 1985–02347, Abstr of JP 59–220395, Dec. 1984.*

* cited by examiner

*Primary Examiner*—Richard L. Schilling
(74) *Attorney, Agent, or Firm*—Burns, Doane, Swecker & Mathis, L.L.P.

(57) ABSTRACT

Disclosed is a support for a lithographic printing plate obtained by subjecting an aluminum plate to a graining treatment and an anodizing treatment, the support comprising at least any one of Mn in a range from 0.1 to 1.5 wt % and Mg in a range from 0.1 to 1.5 wt %; Fe of 0 to 1 wt %; Si of 0 to 0.5 wt %; Cu of 0 to 0.2 wt %; at least one kind of element out of the elements listed in items (a) to (d) below in a range of content affixed thereto, (a) 1 to 100 ppm each of one or more kinds of elements selected from a group consisting of Li, Be, Sc, Mo, Ag, Ge, Ce, Nd, Dy and Au, (b) 0.1 to 10 ppm each of one or more kinds of elements selected from a group consisting of K, Rb, Cs, Sr, Y, Hf, W, Nb, Ta, Tc, Re, Ru, Os, Rh, Ir, Pd, Pt, In, Tl, As, Se, Te, Po, Pr, Sm and Tb, (c) 10 to 500 ppm each of one or more kinds of elements selected from a group consisting of Ba, Co, Cd, Bi and La, and (d) 50 to 1000 ppm each of one or more kinds of elements selected from a group consisting of Na, Ca, Zr, Cr, V, P and S; and Al and incidental impurities as a remaining portion. When the presensitized plate is prepared from this support, a plate has an excellent resistance to aggressive ink staining against a wider range of image recording layers and plate developers corresponding thereto.

2 Claims, 1 Drawing Sheet

SUPPORT FOR LITHOGRAPHIC PRINTING PLATE AND PRESENSITIZED PLATE

BACKGROUND OF THE INVENTION

1. Field of the Invention

The present invention relates to a support for a lithographic printing plate and a presensitized plate, more particularly to a presensitized plate with a high strength where a fatigue fracture does not easily occur, even when the plate is mounted on a plate cylinder of a printing machine with a high tensile force, an anodized layer may not be easily cracked and having an excellent resistance to aggressive ink staining, and a support for a lithographic printing plate used therefor.

In addition, the present invention more particularly relates to a support for a lithographic printing plate where a material cost can be largely reduced, with a very fine crystal grain, excellent surface quality (appearance) and the excellent press life and relates to a presensitized plate using the support.

2. Description of the Related Art

A photosensitive presensitized plate having an aluminum plate as a support is widely used for an offset printing. A presensitized plate is typically manufactured by performing a graining treatment on a surface of an aluminum plate, performing an anodizing treatment, thereafter applying a photosensitive solution and drying the plate so as to form a photosensitive layer (an image recording layer). After the presensitized plate is exposed to an image, it is developed by a plate developer, an exposed portion in case of a positive presensitized plate or a non-exposed portion in case of a negative presensitized plate is removed and plate making is performed, thus a lithographic printing plate is manufactured. In addition, in recent years, a manufacturing method of a presensitized plate using a laser attracts attention and various methods are studied. For example, there is known a photon-system laser lithographic plate using a photopolymerizable composition which is hardened by a visible light laser and a heat mode-system laser lithographic plate using heat or the like generated by a laser light irradiation to record. These systems are very useful since plate making can be performed directly from a digital data in a computer or the like to manufacture a lithographic printing plate.

The lithographic printing plate thus manufactured is then mounted on the plate cylinder of a printing machine, an ink and a fountain solution are supplied to a surface thereof. As they are used for printing, the remaining portion of a photosensitive layer becomes an image area showing an ink affinity, a portion in which a photosensitive layer is removed becomes a non-image area showing a water wettability, thus, it is transcripted on a blanket cylinder and is printed on paper.

As is seen from the foregoing, in a presensitized plate, the physical properties of a photosensitive layer are changed by exposure, and plate making is performed utilizing the changes in the physical properties.

As mentioned above, when a developing processing is performed on a presensitized plate after an image is exposed, there is a case where a surface of a non-image area may be partially eroded by a plate developer, thereby resulting in the deterioration of resistance to aggressive ink staining depending on the conditions of the plate developer. In addition, there is a defect where the level of resistance to aggressive ink staining largely changes depending on whether or not alkali metal silicate is contained in a plate developer. Here "aggressive ink staining" is defined as a defect that inks are attached to a non-image area of a lithographic printing plate in a dotted state or a circular state, thereby resulting in a dotted or a circular scum on paper if printing is intermittently performed many times.

To improve resistance to aggressive ink staining, a number of proposals are presented. Concretely, there are many proposals to specify alloy components contained in an aluminum plate used for a support for a lithographic printing plate. For example, a method by specifying alloy components such as Mg, Mn, Si, Ga, Ti, Cu (JP 5-309964 A, JP 3-177528 A or the like), a method by specifying a ratio of Fe to Si (JP 4-254545 A, JP 7-197162 A or the like), a method by specifying the content of a solid solution of Fe (JP 4-165041 A or the like), a method by specifying a simple Si content (JP 2544215 B, JP 2031725 B or the like), a method by specifying a content, size, distribution or the like of intermetallic compounds (JP 4-165041 A, JP 3-234594 A, JP 2544215 B, JP 4-254545 A or the like) and a method by specifying the characteristics of an anodized layer in combination with specifying alloy components (JP 7-197393 A, JP 7-26393 A or the like) are described.

SUMMARY OF THE INVENTION

Since there has been increasing variety of presensitized plates such as a laser direct recording-type presensitized plate and a conventional analog-type presensitized plate, and the exposure and development have been processed in combination with various plate developers corresponding to image recording layers and the features in their applications, it has been a large problem to control a printing performance which may vary with a plate developer.

In the meantime, efforts to improve various performances of the presensitized plate have been conducted by controlling trace components of aluminum alloys. Since this method is to add only a trace of a certain component to an aluminum alloy, it is advantageous in a point that this addition does not affect the physical properties of a presensitized plate at all.

For example, the inventors of the this application have proposed that the efficiency of electrochemical graining treatment (electrolytic graining treatment) on an aluminum plate may be improved by having the aluminum plate contain, in addition to Fe: 0.05 to 0.5 wt %, Si: 0.03 to 0.15 wt %, Cu: 0.006 to 0.03 wt % and Ti: 0.010 to 0.040 wt %, 1 to 100 ppm of at least one kind element selected from a group consisting of Li, Na, K, Rb, Cs, Ca, Sr, Ba, Sc, Y, Nb, Ta, Mo, W, Tc, Re, Ru, Os, Co, Rh, Ir, Pd, Pt, Ag, Au, C, Ge, P, As, S, Se, Te and Po. (JP 2000-37965 A).

The assignee of this application has proposed that the electrochemical graining characteristic may be further improved by having the aluminum plate contain, in addition to the elements mentioned above, 10 to 200 ppm of Mg, resulting in the improved contact characteristics between the image recording layer and the support in a laser direct-recording type presensitized plate, and in the improved press life of the lithographic printing plate (JP 2001-162958 A).

Moreover, the assignee of this application has proposed to improve the efficiency of electrolytic graining and press life by specifying the concentration of Cu in a depth direction in the vicinity of the surface of an aluminum plate and the relationships between Cu, Si and Ti as well as by adding the foregoing elements (Japanese Patent Application No. 2001-25370).

Since the proposals on the addition of these trace components are, however, not intended to improve resistance to aggressive ink staining, the resistance to aggressive ink staining is not necessarily adequate.

In the meantime, a lithographic printing plate is bent at both ends when it is mounted on a printing machine plate cylinder. Each of the bent portions is fixed in two clamps called gripper portion and gripper edge of printing machine plate cylinder section, after applying tensile force so as to have a lithographic printing plate closely contact with the blanket cylinder, and then the lithographic printing plate is used for printing. Here is a defect that the two bent portions at both ends of the lithographic printing plate are likely to rise out of the plate cylinder due to a reaction force against the bending, therefor, if the plate cylinder is repeatedly pressed to the blanket cylinder under this condition, fatigue fracture is likely to take place since the risen portion is repeatedly bent.

Although this rise may be suppressed by increasing a tensile force applied to the plate when the plate is mounted on the plate cylinder, the lithographic printing plate itself needs a high tensile strength for this purpose. In addition, the inventors of the present invention, on close research and study, have found that if a high tensile force is applied to the lithographic printing plate, an anodized layer existent on its surface is damaged such as being cracked, thereby causing stain during printing.

On a lithographic printing plate, a heating processing called burning-in processing (post-baking processing) is also generally conducted after performing exposure and development. Burning-in processing is normally conducted at a temperature of 200° C. or higher, particularly it is mostly conducted at approx. 240 to 270° C. although it depends on purposes. Press life is improved by further hardening the photosensitive layer of an image area, thereby enabling a larger number of printings. This is because an abrasion during printing is suppressed by hardening the photosensitive layer of an image area.

However, if this burning-in processing is conducted, a problem may arise that a recrystallization or recovery in an aluminum plate takes place, thereby deteriorating the strength of the plate.

Many proposals have been presented in regard to the deterioration of the strength after the burning-in processing is performed. For example, JP 4-73394 B and JP 7-126820 A propose that 0.2% strength after heating or the like should be specified. JP 7-39906 A proposes that a diameter of a crystal grain equivalent to that of a circle in the cross section of a plate should be defined. JP 7-305133 A proposes that a solid solution amount of Fe should be specified.

A number of measures by specifying alloy components are proposed. For example, JP 5-501585 A, U.S. Pat. No. 5,009,722, JP 4-19290 B and U.S. Pat. No. 5,114,825 propose a method by adding Mn. JP 5-462 B, JP 6-37116 B, JP 4-73392 B, JP 3-68939 B and JP 3-11635 B propose a method by adding Mg. JP 5-76530 B and JP 5-28197 B propose a method by adding both Mn and Mg. Moreover, JP 4-72720 or the like proposes a method by adding Zr independently or in combined with Mn or Mg mentioned above.

In the method by defining 0.2% strength or the like after heating, described in JP 4-73394 B, JP 7-126820 A or the like, in the method by defining a diameter of crystal grain equivalent to that of a circle in the cross section of a plate described in JP 7-39906 A, and in the method by specifying a solid solution amount of Fe described in JP 7-305133 A, the drop rate of the tensile strength after burning-in processing is performed becomes smaller, demonstrating an effect to some extent. However, there is a defect that the fatigue fracture of a lithographic printing plate may take place while a large number of printings are repeated.

In addition, although the method by adding Mn or Mg has an effect to prevent the fracture of a plate during printing, the resistance to aggressive ink staining is not always adequate since the method is not intended to improve the resistance to aggressive ink staining.

Therefore, it is the first object of the present invention to provide a support for a lithographic printing plate such that (1) a plate has an excellent resistance to aggressive ink staining against a wider range of image recording layers and plate developers corresponding thereto, (2) a fatigue fracture does not easily take place in a plate since the plate has a high strength, and the adequate strength of a plate is still maintained even after burning-in processing is performed and (3) even when a plate is mounted on a printing machine plate cylinder with a high tensile force, an anodized layer is not easily cracked, when the presensitized plate is prepared, by adding a trace of specified components to an aluminum plate used, and a lithographic printing plate using the support for a lithographic printing plate.

In addition, a support for a lithographic printing plate is conventionally manufactured by performing graining treatment on one side or both sides of an aluminum alloy plate and anodizing treatment for improving abrasion resistance. A presensitized plate is manufactured by providing a photosensitive layer on the support for a lithographic printing plate. In addition, a fine profile irregularities called a mat layer may be provided on the surface of the photosensitive layer in order to shorten a vacuum contact time at the time of plate making.

A lithographic printing plate is prepared by various types of plate making processings such as image exposure, development, water washing or the like on a presensitized plate thus manufactured. The following methods for image exposure are used; a method by differentiating an image area from a non-image area by contacting a lith film to which the image is printed and irradiating, a method by differentiating an image area from a non-image area with a method by directly recording the image area or the non-image area by using a laser or projecting an image.

When a development processing is performed after image exposure, an undissolved photosensitive layer forms an image area as an ink receptor, and in an area from which a photosensitive layer is removed by being dissolved, an aluminum alloy or an anodized layer beneath the area is exposed, which forms a non-image area as a water receptor. If required, treatment for water wettability, gumming, burning-in processing or the like may be performed after development.

This lithographic printing plate is mounted on a cylinder-shaped printing machine plate cylinder, to which an ink and a fountain solution are supplied, thereby enabling the ink to be attached to an image area having ink receptivity and the water to be attached to a non-image area having water wettability. After the ink of the image area is transferred to a blanket cylinder, an image is printed on paper from the blanket cylinder. If a contact between the photosensitive layer of the image area and the support is inadequate, a problem that printing terminates with a small number of sheets of papers may take place. As a method of improving a contact between the photosensitive layer of the image area and the support, the following methods are known; i.e., a method by providing an intermediate layer between an aluminum alloy plate and the photosensitive layer, and a method by evenly performing a graining treatment on an aluminum alloy plate or the like are known.

The following can be used as an intermediate layer for undercoating; i.e., amino acids and their salts (alkali metallic salts such as Na salt, K salt or the like; ammonium salt; hydrochloride; oxalate; acetate: phosphate or the like) as described in JP 60-149491 A, amines having hydroxy group and their salts (hydrochloride, oxalate, phosphate or the like) as described in JP 60-232998 A, compounds having amino group and phosphonic group and their salts as described in JP 63-165183 A. In addition, compounds having phosphor group as described in JP 4-282637 A can be used as an intermediate layer. Moreover, it is known that high molecular compounds containing acid group and onium group as described in JP 11-109637 A are used as an intermediate layer after alkali metallic silicate processing is performed. However, in a method by providing an intermediate layer for contact between a grained surface and a photosensitive layer, there is of course a problem that a manufacturing cost for providing an intermediate layer becomes higher.

In the meantime, there is known a method by specifying alloy components which are contained in aluminum alloy and largely affect graining treatment.

Many proposals are described as a method by specifying alloy components. For example, concerning JIS 1050 materials, the inventors of the present invention have described the related arts in JP 59-153861 A, JP 61-51395 A, JP 62-146694 A, JP 60-215725 A, JP 60-215726 A, JP 60-215727 A, JP 60-215728 A, JP 61-272357 A, JP 58-11759 A, JP 58-42493 A, JP 58-221254 A, JP 62-148295 A, JP 4-254545 A, JP 4-165041 A, JP 3-68939 B, JP 3-234594 A, JP 1-47545 B and JP 62-140894 A. In addition, JP 1-35910 B, JP 55-28874 B and the like are also known as the related ones. Regarding JIS 1070 materials, the inventors of the present invention have described the related arts in JP 7-81264 A, JP 7-305133 A, JP 8-49034 A, JP 8-73974 A, JP 8-108659 A and JP 8-92679 A.

Regarding Al—Mg system alloys; the inventors of the present invention have described the related arts in JP 62-5080 B, JP 63-60823 B, JP 3-61753 B, JP 60-203496 A, JP 60-203497 A, JP 3-11635 B, JP 61-274993 A, JP 62-23794 A, JP 63-47347 A, JP 63-47348 A, JP 63-47349 A, JP 64-61293 A, JP 63-135294 A, JP 63-87288 A, JP 4-73392 B, JP 7-100844 B, JP 62-149856 A, JP 4-73394 B, JP 62-181191 A, JP 5-76530 B, JP 63-30294 A and JP 6-37116 B. JP 2-215599 A and JP 61-201747 A are also known.

Regarding Al—Mn system alloys, the inventors of the present invention have described the related arts in JP 60-230951 A, JP 1-306288 A and JP 2-293189 A. JP 54-42284 B, JP 4-19290 B, JP 4-19291 B, JP 4-19292 B, JP 61-35995 A, JP 64-51992 A, U.S. Pat. No. 5,009,722, U.S. Pat. No. 5,028,276, JP 4-226394 A and the like are also known.

Regarding Al—Mn—Mg system alloys, the inventors of the present invention have described the related arts in JP 62-86143 A and JP 3-222796 A. JP 63-60824 B, JP 60-63346 A, JP 60-63347 A, EP 223737 A, JP 1-283350 A, U.S. Pat. No. 4,818,300, GB 1222777 and the like are also known.

Regarding Al—Zr system alloys, the inventors of the present invention have described the related arts in JP 63-15978 B and JP 61-51395 A. JP 63-143234 A, JP 63-143235 A and the like are also known. Regarding Al—Mg—Si system alloys, GB 1421710 and the like are also known. All of them, however, are intended to limit aluminum materials and have demerits that lower freedom of selection of materials and require high-priced new metals and predetermined elements to be added for alloy.

These alloys are manufactured in the following processings; i.e., normally raw material chiefly composed of aluminum is dissolved, to which predetermined metals are added to prepare an aluminum alloy molten metal of a predetermined alloy component, a purifying processing is then performed on the aluminum alloy molten metal and casting is finally performed. In the purifying processing, the following steps are taken to remove unnecessary gas such as hydrogen in the molten metal; i.e., flux processing; degassing processing using Ar gas, Cl gas or the like; filtering using so-called rigid media filters such as ceramic tube filter, ceramic form filter, filters with filtering materials of alumina flake, alumina ball or the like, and glass cloth filters or the like; processing combining degassing processing with filtering, or the like. It is preferable that these purifying processings shall be performed to prevent a non-metallic inclusion in the molten metal, a defect caused by foreign matters such as oxides and a defect caused by gases dissolved in the molten metal.

As is seen from the foregoing, casting is conducted by using a molten metal on which each purifying processing has been performed. As for casting methods, there are one method using a fixed mold which is represented by DC casting method and another using a driven mold which is represented by continuous casting method.

With DC casting method, a cooling speed is set at a range of 1 to 300° C./sec. Although in this processing the aforementioned alloy component elements are partially dissolved in aluminum, the components which can not be dissolved in the aluminum form various intermetallic compounds, which remain in an ingot. DC casting method can manufacture an ingot of 300 to 800 mm in thickness and on which facing is performed in accordance with the normal method, the ingot is cut by 1 to 30 mm in depth from a surface layer, preferably 1 to 10 mm deep. Thereafter, soaking processing is performed as required. Unstable intermetallic compounds are converted into stable ones and a part of them are dissolved in aluminum by performing soaking processing. After the soaking processing, although remaining intermetallic compounds become smaller in diameter or are dispersed during hot rolling and cold rolling, the kinds thereof remain almost intact. Namely, they finally remain on an aluminum alloy plate, that is, a support for a lithographic printing plate.

Also, a thermal processing called annealing may be performed before and after or during cold rolling. In this case, a part of elements dissolved in aluminum may deposit as deposit of intermetallic compounds or a simple element depending on the temperature of a thermal processing of annealing. Also in this case, the deposit remains in an aluminum alloy plate.

The aluminum alloy plate finished to a predetermined thickness (0.1 to 0.5 mm) by cold rolling may be subjected to flatness improvement processing of by a correcting equipment such as a roller leveler or tension leveler.

As a casting method, a continuous casting method may be used. The following methods can be used; i.e., two-rolling continuous casting method represented by Hunter method or 3C method, two-belt continuous casting method represented by belt caster of Husrey method and block caster of Alusuisse method or the like. For example, if a two-rolling method used, a cooling speed is set at a range of 100 to 1,000° C./sec. In the meantime, if a two-belt method is used, a cooling speed is set at a range of 10 to 500° C./sec. In any method, a plate with a determined thickness (0.1 to 0.5 mm) is prepared by cold rolling or rolling processing combining hot rolling with cold rolling, after casting is performed. Also, a thermal processing may be performed if necessary during these processings. An aluminum alloy plate finished with a predetermined thickness by cold rolling may be subjected to flatness improvement processing by correcting equipment such as roller leveler and tension leveler. Since these continuous casting methods are characterized by being capable of dispensing with facing process which is required by DC casting method, it has a merit that the running cost is smaller than that of DC casting method.

Since aluminum as a raw material is prepared to be a predetermined alloy component, an aluminum ingot of a purity 99.7% or higher called a new metal is used or aluminum rubbish generated from manufacturing processes in an aluminum plant, of which an alloy component is known is used. An aluminum alloy called a master alloy containing predetermined elements is added or a metal ingot composed of predetermined elements is added as required, thus an aluminum alloy material having a predetermined alloy component is manufactured.

However, an aluminum alloy material containing new metal or predetermined element components being added has a demerit that it is high-priced. If aluminum rubbish generated from manufacturing processes in an aluminum plant with a known alloy components is used, there is a merit that the recovery rate of raw material is improved. However, the cost is not very low.

In an effort to overcome the problem that a raw material is high-priced, the inventors of the present invention have proposed a method that an aluminum ingot of purity 99.7% or higher only is used to dispense with a master alloy or a metal ingot containing predetermined elements in JP 7-81260 A. The inventors of the present invention have also proposed a method of recycling an end-of-life lithographic printing plate or a lithographic printing plate which becomes defective under a manufacturing process as an aluminum raw material in JP 7-205534 A.

Even though these methods are used, the cost of an aluminum ingot of purity 99.7% or higher can not be largely reduced, and a large practical effect can not be obtained since it is rather difficult to secure an end-of-life lithographic printing plate as a stable raw material.

In order to solve the aforementioned problems, use of a material of which an alloy component is not controlled, that is, scrap that contains various impurities, or secondary metal or metal called regenerated metal containing many impure elements which are rather lower market-priced than that of new metal as raw materials may be considered. However, since almost no control is made on alloy components in these materials, they could never be used for the raw material which requires a high-quality appearance after surface treatment and printing performance as in a lithographic printing plate. Particularly, there is a problem that the press life is inferior since even graining can not be obtained, and thus a contact with a photosensitive layer is inadequate.

In the meantime, the inventors of this application have already proposed in Japanese Patent Application No. 2001-90960 the following support for a lithographic printing plate based on an aluminum alloy plate that an aluminum content is 94 to 99.4 wt %: a support for a lithographic printing plate where at least graining treatment and anodizing treatment are performed on the aluminum alloy plate; moreover, a support for a lithographic printing plate containing an aggregate content of Si and Mn, 0.5 wt % or higher; a support for a lithographic printing plate, on a grained surface of which intermetallic compounds with a diameter of 0.1 $\mu$m or larger, partially exist by 5,000 to 35,000 pcs/mm$^2$; a support for a lithographic printing plate containing Cu by 0.05 wt % or more; a support for a lithographic printing plate where the raw material of these aluminum alloy plates contain at least one kind of an aluminum regenerated metal and aluminum scrap or the like by 1 wt %.

The inventors of this application have filed the application since it has been found that this method can reduce the cost of Al raw material and a contact between a photosensitive layer and a support can be improved by increasing the density of intermetallic compounds with a diameter of 0.1 $\mu$m or larger existing on the surface more than that of conventional materials.

The inventors of the present invention, however, have found that on further close examination, an optimum kind of intermetallic compound and a range of density are necessary considering a recent wide variety of image recording layers and the characteristics of the image recording layer and the stability of development processing.

Consequently, it is the second object of the present invention to provide a support for a lithographic printing plate, which has no need to have a high-priced intermediate layer, no need to perform a graining treatment under a special condition, uses an extremely lower-priced material and has excellent appearance of the surface of the support, and where a contact between a photosensitive layer and the support and thus press life are also excellent, and to provide a presensitized plate using the support for a lithographic printing plate.

The inventors of the present invention, on close examination, have found that resistance to aggressive ink staining of a lithographic printing plate can be improved by having the plate contain a specified content of Mn and/or Mg in an aluminum plate and adding a trace of a specified alloy component thereto, not depending on the conditions of an image recording layer and plate developers, that a content in an aluminum plate is different by element in order to obtain such effect, moreover, that the plate gains such a high strength that fatigue fracture does not easily take place, thus the plate can have a sufficient strength even if burning-in processing is performed, and that even though a plate is mounted on a printing machine plate cylinder with a high tensile force, an anodized layer is not easily cracked, and the inventors have completed the first aspect of the present invention.

That is, the first aspect of the present invention is that a support for a lithographic printing plate obtained by subjecting an aluminum plate to a graining treatment and an anodizing treatment, the support comprising:

at least any one of Mn in a range from 0.1 to 1.5 wt % and Mg in a range from 0.1 to 1.5 wt %;

Fe of 0 to 1 wt %;

Si of 0 to 0.5 wt %;

Cu of 0 to 0.2 wt %;

at least one kind of element out of the elements listed in items (a) to (d) below in a range of content affixed thereto, (a) 1 to 100 ppm each of one or more kinds of elements selected from a group consisting of Li, Be, Sc, Mo, Ag, Ge, Ce, Nd, Dy and Au, (b) 0.1 to 10 ppm each of one or more kinds of elements selected from a group consisting of K, Rb, Cs, Sr, Y, Hf, W, Nb, Ta, Tc, Re, Ru, Os, Rh, Ir, Pd, Pt, In, Ti, As, Se, Te, Po, Pr, Sm and Tb, (c) 10 to 500 ppm each of one or more kinds of elements selected from a group consisting of Ba, Co, Cd, Bi and La, and (d) 50 to 1000 ppm each of one or more kinds of elements selected from a group consisting of Na, Ca, Zr, Cr, V, P and S; and Al and incidental impurities as a remaining portion.

Therefore, the support for a lithographic printing plate according to the first aspect according to the present invention is very useful, since it shows excellence in resistance to aggressive ink staining against various image recording layers and plate developers corresponding thereto, a high strength and an excellence in resistance to plate fracture, and no dirt resulting from cracking of an anodized layer.

The inventors of the present invention have also found that in order to achieve the second objective of the present invention, a kind of intermetallic compound of an aluminum plate after graining treatment is performed, preferably after anodizing treatment is performed and the density of intermetallic compounds existing on the surface of the plate should be set in specified ranges and have completed the second aspect of the present invention.

That is, the second aspect of the present invention is to provide a support for a lithographic printing plate obtained by subjecting an aluminum plate with an aluminum content 95 to 99.4 wt % to a graining treatment, the support comprises three kinds of intermetallic compounds or more, wherein one kind or more of intermetallic compounds consist of two kinds of elements, and one or more kinds of intermetallic compounds other than these intermetallic compounds consist of four kinds of elements, and a density of intermetallic compounds existing on the surface of the support among these compounds ranges 3,000 to 35,000 $pcs/mm^2$. One of the preferred aspects is that the aluminum plate contains 1 wt % or more of at least one kind out of an aluminum regenerated metal and aluminum scrap.

The present invention also provides a presensitized plate having an image recording layer on the support for the lithographic printing plate mentioned above.

One of the preferred aspects is that the image recording layer is of a laser direct recording type thermal sensitive material.

One of the preferred aspects is that the image recording layer is of a laser direct recording type photopolymer sensitive material.

One of the preferred aspects is that the image recording layer is of an analog type thermal sensitive material.

Therefore, according to the second aspect of the present invention, there can be provided with a support for a lithographic printing plate excellent in a contact with a photosensitive layer and press life despite of raw materials containing an extremely cheap materials or regardless of the type of graining treatment, having the kinds of intermetallic compound, and the density of intermetallic compounds existing on the surface of an aluminum plate after graining treatment is performed as indexical properties, and a presensitized plate using the support.

When a lithographic printing plate is prepared from a presensitized plate according to the present invention which uses a support for a lithographic printing plate of the first aspect according to the present invention, a mechanism that resistance to aggressive ink staining becomes excellent and a mechanism that an anodized layer is not easily cracked even if a high tensile force is applied are not clear at present. However, it is considered that the soundness of an anodized layer, chemical resistance and cracking resistance are improved and resistance to aggressive ink staining is thus improved. Concretely, it is considered that intermetallic compounds that are likely to be the trigger of a defect in an anodized layer is converted into a harmless substance and the density of an anodized layer itself is increased by adding a trace of the aforementioned elements.

BRIEF DESCRIPTION OF THE DRAWING

FIG. 1 is a schematic view of the brush graining process used for a mechanical graining treatment in preparing a support for a lithographic printing plate according to the present invention.

DETAILED DESCRIPTION OF THE PREFERRED ASPECTS

Figure 1:
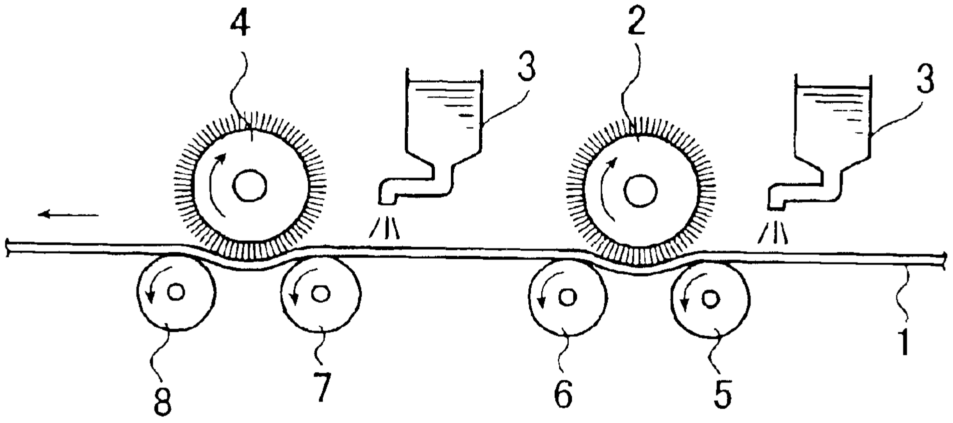
FIG. 1

Below are the detailed descriptions of the present invention.

A Support for a Lithographic Printing Plate

First, a support for a lithographic printing plate of the first aspect according to the present invention is described here.

<An Aluminum Plate (Rolled Aluminum)>

An aluminum alloy is used for a support for a lithographic printing plate of the first aspect according to the present invention. The essential alloy components of the aluminum alloy are (1) Al, (2) at least any one of Mn and Mg and (3) at least one kind of specified trace elements.

A trace of Mn is contained in new metal. Mn is relatively easily dissolved in aluminum and forms intermetallic compounds with Al, Fe, Si or the like. Mn improves the mechanical strength of an aluminum plate and affects the electrochemical graining properties of the aluminum plate.

In the first aspect according to the present invention, an aluminum plate contains 0.1 to 1.5 wt % of Mn independently or in combination with Mg. If Mn content is 0.3 wt % or more, an effect improving a mechanical strength is enhanced.

A trace of Mg is contained in new metal. Mg can improve the heat dehardening resistance and mechanical strength of an aluminum plate. Therefore, an effect improving the strength against fatigue fracture after burning-in processing is large. Mg is rather likely to be dissolved in aluminum. It is also known that Mg forms intermetallic compounds with Si.

In the first aspect according to the present invention, an aluminum plate contains 0.1 to 1.5 wt % of Mg independently or in combination with Mn. If Mn content is 0.3 wt % or more, the effect improving the mechanical strength is enhanced.

Described below are regarding a specified trace elements which are the feature of the first aspect according to the present invention. In the first aspect according to the invention, the aluminum plate contains a specified content of at least one kind of element out of the elements listed in items (a) to (d) mentioned below.

(a) One or More Kinds of Elements Selected From a Group Consisting of Li, Be, Sc, Mo, Ag, Ge, Ce, Nd, Dy and Au These elements show an effect improving resistance to aggressive ink staining if added a relatively small amount thereof. A content required to show the effect is lppm or more, respectively.

In addition, if the content is too much, it is not preferable since the effect is saturated and a disadvantage is brought about from the viewpoint of a cost. In the first aspect according to the present invention, the content is defined to be 100 ppm or less, and it should preferably be 10 ppm or less from the viewpoint of cost reduction.

Therefore, the content is defined to be 1 to 100 ppm. In addition, in case where an aluminum plate contains two kinds or more out of these elements, it is acceptable if at least one kind element meets the aforementioned range.

(b) One or More Kinds of Elements Selected From a Group Consisting of K, Rb, Cs, Sr, Y, Hf, W, Nb, Ta, Tc, Re, Ru, Os, Rh, Ir, Pd, Pt, In, Tl, As, Se, Te, Po, Pr, Sm and Tb Each element shows an effect improving resistance to aggressive ink staining if added a trace thereof. A content required to show the effect is 0.1 ppm or more.

In addition, if the content is too much, it is not preferable since the effect is saturated and a disadvantage is brought about from the viewpoint of a cost. In the first aspect according to the present invention, the content is defined to be 10 ppm or less, and it should preferably be 5 ppm or less from the viewpoint of cost reduction.

Therefore, the content is defined to be 0.1 to 10 ppm. In addition, in case where an aluminum plate contains two kinds or more out of these elements, it is acceptable if at least one kind element meets the aforementioned range.

(c) One or More Kinds of Elements Selected From a Group Consisting of Ba, Co, Cd, Bi and La Each element shows an effect improving resistance to aggressive ink staining if added a content of 10 ppm or more thereof.

In addition, if the content is too much, it is not preferable since the effect is saturated and a disadvantage is brought about from the viewpoint of a cost. In the first aspect according to the present invention, the content is defined to be 500 ppm or less, and it should preferably be 100 ppm or less from the viewpoint of cost reduction.

Therefore, the content is defined to be 10 to 500 ppm. In addition, in case where an aluminum plate contains two kinds or more out of these elements, it is acceptable if at least one kind element meets the aforementioned range.

(d) One or More Kinds of Elements Selected From a Group Consisting of Na, Ca, Zr, Cr, V, P and S Each element shows an effect improving resistance to aggressive ink staining if added 50 ppm or more thereof.

In addition, if the content is too much, it is not preferable since an effect is saturated and a disadvantage is brought about from the viewpoint of a cost. In the first aspect according to the present invention, the content is defined to be 1,000 ppm or less, and it should preferably be 500 ppm or less from the viewpoint of cost reduction.

Therefore, the content is defined to be 50 to 1,000 ppm. In addition, in case where an aluminum plate contains two kinds or more out of these elements, it is acceptable if at least one kind element meets the aforementioned range.

An aluminum alloy used for the first aspect according to the invention can contain one kind element or more selected from a group consisting of Fe, Si and Cu as optional components.

Fe is an element that is contained by a concentration of approx. 0.1 to 0.2 wt % in new metal and an amount dissolved in the aluminum is small and most of the content remains as intermetallic compounds. Although Fe has an action to enhance the mechanical strength of an aluminum alloy, cracking easily occurs during rolling if the content exceeds 1 wt %. Moreover, It is not practical to decrease Fe content below 0.1 wt %.

$Al_3Fe$, $Al_6Fe$, AlFeSi series compounds, AlFeSiMn series compounds or the like are typical intermetallic compounds.

In the first aspect according to the present invention, Fe is an optional component which is contained in a range of 1 wt % or less. It is preferable that Fe content is 0.1 wt % or more and also that the content is 0.7 wt % or less.

Si is an element that is contained by a concentration of approx. 0.02 to 0.1 wt % in a new metal. Si exists in an dissolved state in aluminum, or exists as intermetallic compounds or a single deposit. Also, if a plate is heated during the manufacturing process of a support for a lithographic printing plate, dissolved Si may deposit as a simple Si deposit. According to a finding by the inventors of the present invention, resistance to aggressive ink staining deteriorates if simple Si is excessive. In addition, Si content affects the electrochemical graining properties of an aluminum plate.

AlFeSi series compounds, AlFeSiMn series compounds, $Mg_2Si$ or the like are typical intermetallic compounds.

In the first aspect according to the present invention, Si is an optional component which is contained in a range of 0.5 wt % or less. It is preferable that Si content is 0.02 wt % or more.

Cu is an element that a trace thereof is contained in new metal. Cu is rather likely to be dissolved in aluminum. Cu largely affects the electrochemical graining properties of an aluminum plate.

In the first aspect according to the present invention, Cu is an optional component and is contained in a range of 0.2 wt % or less in accordance with a required electrochemical graining properties.

The remaining portion of an aluminum plate is composed of Al and unavoidable impurities. Most of the unavoidable impurities are contained in Al metal. If the unavoidable impurities are, for example, contained in a metal of Al with purity of 99.7%, the effect of the first aspect according to the present invention is not impaired. It is acceptable if an amount of unavoidable impurities contained is within the range described in, for example, "Aluminum Alloys: Structure and properties" (1976) authored by L. F. Mondolfo or the like.

Examples of unavoidable impurities contained in an aluminum alloy are Zn, Ti, B, Ga and Ni.

A trace of Zn is contained in new metal. Zn is rather easily dissolved in aluminum. Zn affects the electrochemical graining properties of the aluminum plate. If in the first aspect according to the present invention, Zn content is 0.05 wt % or less, the effect of the first aspect according to the present invention is not impaired.

Ti is an element that is normally added by 0.01 to 0.05 wt % as a crystal refinement material. Ti is mainly added as intermetallic compounds with Al or as $TiB_2$. If Ti is excessively contained, it may affect the electrochemical graining properties of the aluminum plate.

If in the first aspect according to the present invention, Ti content is 0.05 wt % or less, the effect of the first aspect according to the present invention is not impaired.

B may be added with Ti as a crystal refinement material. If, in the first aspect according to the present invention, B content is 0.05 wt % or less, the effect of the first aspect according to the present invention is not impaired.

A trace of both Ga and Ni may be contained as impurities of a metal. If each content is 0.05 wt % or less, the effect of the first aspect according to the present invention is not impaired.

When an aluminum alloy is prepared to be a plate material, the following method can be adopted, for example. First, a purification processing is performed on an aluminum alloy molten metal that is controlled at a predetermined alloy component content in accordance with the normal method and casting is performed. In the purification processing, unnecessary gases such as hydrogen and solid impurities which are mixed in the molten metal are removed. As a purification processing to remove unnecessary gases, flux processing, degassing processing using argon gas, chlorine gas or the like can be cited, for example. Also, as a purification processing to remove solid impurities, cited for example are various filtering processings using so-called rigid media filters such as ceramic tube filter and ceramic form filter, a filter with alumina flake or alumina ball or the like as filtering media and a glass cloth filter or the like. In addition, a purification processing combining degassing processing and filtering processing may be performed.

It is preferable that these processings are implemented to prevent a defect caused by foreign matters such as non-metallic inclusion and oxides in the molten metal and a defect caused by gases dissolved in the molten metal. Filtering processing of the molten metal, for example, can use the methods as described in JP 6-57342 A, JP 3-162530 A, JP 5-140659 A, JP 4-231425 A, JP 4-276031 A, JP 5-311261 A and JP 6-136466 A. In addition, degassing processing of the molten metal, for example, can use the methods as described in JP 5-51659 A, JP 5-51660 A, JP 5-49148 A and JP 7-40017 A.

Subsequently, an aluminum alloy molten metal is cast by either of the casting method using a fixed mold represented by DC casting method and a casting method using a driven mold represented by a continuous casting method.

If DC casting method is used, a molten metal is solidified at a cooling speed in a range of 1 to 300° C./sec. If the cooling speed is less than 1° C./sec, it is not preferable since a large number of bulky intermetallic compounds may be formed.

As continuous casting method, a method with a cooling roll represented by a two-rolling method and 3C method and a method with a cooling belt or a cooling block represented by a two-belt method and Alusuisse caster II type are performed in industry. If a continuous method is used, a molten metal is solidified at a cooling speed in a range of 100 to 1,000° C./sec. Since the continuous casting method is generally of a faster cooling speed than that of DC casting method, it has a feature that the solid solution degree of an alloy component to an aluminum matrix can be enhanced. The continuous casting method, for example, can use the method as disclosed in JP 3-79798 A, JP 5-201166 A, JP 5-156414 A, JP 6-262203 A, JP 6-122949 A, JP 6-210406 A and JP 6-262308 A.

Since in case of DC casting method, an ingot with a thickness of 300 to 800 mm is manufactured, facing is performed on a surface layer by 1 to 30 mm deep, preferably 1 to 10 mm deep in accordance with the normal method. Thereafter, soaking is performed as required. If soaking is performed, a thermal processing is performed at 450 to 620° C. for 1 to 48 hours so as not to enlarge intermetallic compounds. If a time is less than one hour, the effect of soaking processing may be inadequate. Soaking processing may be omitted if intermetallic compounds need not be stabilized.

Thereafter, a rolled plate of an aluminum alloy plate is produced by performing hot rolling and cold rolling. The starting temperature of 350 to 500° C. is adequate for hot rolling. Intermediate annealing may be performed before or after or during cold rolling. The conditions thereof are that a plate is heated by a batch type annealer at 280 to 600° C. for 2 to 20 hours, preferably at 350 to 500° C. for 2 to 10 hours, or a plate is heated by a continuous annealer at 400 to 600° C. for six min. or less, preferably at 450 to 550° C. for two min. or less. Alternatively, crystal structure can be fined by heating a plate at a heating rate of 10° C./sec. or more with a continuous annealer. If the crystal structure is fine at a time when hot rolling terminates, an intermediate annealing may be omitted. Cold rolling, for example, can use the method as described in JP 6-210308 A.

The flatness of an aluminum plate finished with a predetermined thickness of, for example, 0.1 to 0.7 mm may be improved by a correcting equipment such as a roller leveler and tension leveler.

In addition, the aluminum plate is arranged so as to pass through a slitter line in order to be machined to a predetermined width.

In case of a continuous casting, it has a merit that hot rolling process can be omitted since a continuous casting and rolling can be performed directly on a cast plate of 1 to 10 mm in thickness, if a method with a cooling roll of a two-roll method or the like is used, for example. In addition, if a method with a cooling belt of a two-belt method or the like is used, a cast plate of 10 to 50 mm in thickness can be cast. Generally, a continuously cast and rolled plate of 1 to 10 mm in thickness can be obtained by continuously performing rolling with hot rolling just after casting.

A continuously cast and rolled plate obtained by these methods is put into processings such as cold rolling, intermediate annealing, improvement of flatness and slitting, thus the plate is finished with a predetermined thickness of, for example, 0.1 to 0.7 mm, as described in the case of DC casting. If a continuous casting is used, with respect to the conditions for intermediate annealing and cold rolling the methods can be used, for example, which are described in JP 6-220593 A, JP 6-210308 A, JP 7-54111 A and JP 8-92709 A.

Although a support for a lithographic printing plate of the first aspect according to the present invention can be obtained by performing graining treatment and anodizing treatment on the aforementioned aluminum plate and providing a specified surface geometry on it, it is also acceptable that various processes other than graining treatment and anodizing treatment may be included in the manufacturing process of this support for a lithographic printing plate.

Described below are various surface treatments performed on an aluminum plate.

<Graining Treatment>

To obtain preferable surface geometry, graining treatment is performed on the aforementioned aluminum plate. Graining treatment can be exemplified by a mechanical graining, chemical etching, electrolytic graining or the like as described in JP 56-28893 A. In addition, the following methods can be used; i.e., electrochemical graining which electrochemically performs graining in hydrochloric acid electrolyte or in nitric acid electrolyte (electrochemical graining treatment, electrolytic graining treatment) and mechanical graining methods (mechanical graining treatment) such as wire brush graining method where an aluminum surface is scratched with a metallic wire, ball graining method where graining is performed on an aluminum surface with a polishing ball and an abrasive, brush graining method where graining is performed on an aluminum surface with a nylon brush and an abrasive. These graining methods can be used independently or in combination with others. Examples are the following such as a combination of mechanical graining treatment using nylon brush and an abrasive and electrolytic graining treatment using hydrochloric acid electrolyte or nitric acid electrolyte, and a combination of a plurality of electrolytic graining treatment.

In case of the brush graining method, the average depth of a recess formed by a long wavelength component (large undulation) on the surface of a support for a lithographic printing plate can be controlled by suitably selecting the conditions such as the mean grain diameter and maximum grain diameter of grains used as an abrasive, the hair diameter, density and thrust pressure of brush. It is preferable that the mean wavelength of a recess obtained by the brush graining method is 2 to 30 $\mu$m and the mean depth is 0.3 to 1 $\mu$m.

An electrochemical method which chemically performs graining in hydrochloric acid electrolyte or in nitric acid electrolyte is preferable as an electrochemical graining treatment method. A preferred current density is a quantity of electricity of 50 to 400 $C/dm^2$ at an anode. More concretely, for example, graining is performed with DC or AC in an electrolyte containing 0.1 to 50 wt % of hydrochloric acid or nitric acid under the conditions at 20 to 100° C., at current density of 100 to 400 $C/dm^2$ for 1 second to 30 minutes. Since electrochemical graining treatment can easily give fine irregularities to the surface of a plate, a contact between an image recording layer and a support can be enhanced.

Crater-like or honeycomb-like pits of mean diameter of approx. 0.05 to 2.0 $\mu$m and mean depth of 0.01 to 0.4 $\mu$m can be produced at an area rate of 90 to 100% on the surface of an aluminum plate by performing electrolytic graining treatment after a mechanical graining treatment is conducted.

The provided pits have an action to improve the scum resistance and press life of a non-image area on a printing plate. With electrolytic graining treatment, an important condition is a quantity of electricity required to provide sufficient pits on the surface of a plate, namely, a product obtained by multiplying current by time in which the current is passed. It is preferable that adequate pits can be formed with a less quantity of electricity from the viewpoint of energy saving, too.

It is preferable that the surface roughness after graining treatment is 0.2 to 0.6 $\mu$m as the arithmetical mean ($R_a$) roughness obtained by measuring with cut-off value of 0.8 mm and evaluated length of 3.0 mm in accordance with JIS B0601-1994.

<Alkali Etching Treatment>

It is preferable that etching should be chemically performed on the aluminum plate which was subjected to the graining treatment as described.

Although alkaline agents preferably used in the first aspect according to the present invention are not particularly limited, sodium hydroxide, sodium carbonate, sodium aluminate, sodium metasilicate, sodium phosphate, potassium hydroxide and lithium hydroxide may be used.

It is preferable that alkali etching treatment is performed under the condition that dissolved content of Al is 0.05 to 5.0 $g/m^2$ and particularly, the processing is performed under the condition that dissolved content of Al is 0.5 $g/m^2$ or less if it is performed after electrolytic graining treatment. In addition, although other conditions are not particularly limited, the concentration of an alkali is preferably 1 to 50 wt %, and more preferably 5 to 30 wt %, and the temperature of an alkali is preferably 20 to 100° C. and more preferably 30 to 50° C. is better.

Alkali etching treatment is not limited to only one method and a plurality of processings can be combined with each other.

Alkali etching treatment is not limited to only one-step processing. For example, alkali etching treatment is preformed after a mechanical graining treatment is performed, desmutting process (pickling to remove desmut mentioned later) is then performed, electrolytic graining treatment is further performed and then alkali etching is again performed, subsequently, desmutting process is performed. As described, a combination of alkali etching treatment with desmutting process can be performed several times.

The diameter of a pit constituting a grained structure with medium undulation can be controlled in a somewhat preferable range by this alkali etching treatment. At the same time, a grained structure of small undulation with very fine irregularities inside pits can be formed. Very fine irregularities are of irregular shape and the diameter equivalent to that of a circle (the diameter equivalent to that of an area circle) is 0.01 to 0.2 $\mu$m.

Pickling (desmutting process) is performed to remove dirt (smut) remaining on the surface of a plate after alkali etching treatment is performed. As acids for use, nitric acid, sulfuric acid, phosphoric acid, and chromic acid, hydrofluoric acid, fluoroboric acid are cited. Particularly, a smut removal processing method after electrolytic graining treatment can be preferably exemplified by the method where the plate is made to contact with 15 to 65 wt % sulfuric acid at a temperature of 50 to 90° C. as described in JP 53-12739 A.

<Anodizing Treatment>

Anodizing treatment is further performed on the aluminum plate processed as above. In this case, although micro pores existing in an anodized layer have an effect improving a contact with an image recording layer, an appropriate sized micro pore is required since its sensitivity may deteriorate if the diameter of a micro pore is too large. Anodizing treatment can be performed by a conventional method. Concretely, an anodized layer can be formed on the surface of an aluminum plate by passing DC or AC through an aluminum plate dipped in a aqueous solution containing sulfuric acid as a principal component, as required, combined with phosphoric acid, chromic acid, oxalic acid, sulfamic acid, benzenesulfonic acid or the like.

In this case, the components normally contained in at least an Al alloy plate, an electrode, city water, underground water or the like may be contained in an electrolyte. Moreover, a second component or a third component may also be added. For the second component or the third component, examples are metal ions such as Na, K, Mg, Li, Ca, Ti, Al, V, Cr, Mn, Fe, Co, Ni, Cu and Zn; positive ions such as ammonium ion; negative ions such as nitrate ion, carbonate ion, chloride ion, phosphate ion, fluoride ion, sulfite ion, titanate ion, silicate ion, borate ion or the like. Either of them may be contained at the concentration of approx. 0 to 10,000 ppm.

Although the conditions of anodizing treatment can not be indiscriminately determined since they may vary depending on an electrolyte to be used, it is appropriate that generally the concentration of an electrolyte is 1 to 15 wt %, the temperature of the electrolyte is −5 to 40° C., current density is 5 to 60 $A/dm^2$, voltage is 1 to 200 V and electrolysis time is 10 to 200 seconds.

It is preferable that in the first aspect according to the present invention, the amount of an anodized layer is 1 to 5 $g/m^2$. If less than 1 $g/m^2$, a plate is likely to be scratched, if more than 5 $g/m^2$, it is economically disadvantageous since a manufacturing process inevitably requires a large electric power energy. It is preferable that the amount of an anodized layer is 1.5 to 4 $g/m^2$.

<Alkali Metal Silicate Processing>

Dipping processing is performed on a support for a lithographic printing plate on which an anodized layer is formed by the above processing, by using a aqueous solution of an alkali metal silicate as required.

Although the processing conditions are not particularly limited, for example, the support is dipped in a aqueous solution with the concentration of 0.01 to 5.0 wt % at a temperature of 5 to 40° C. for 1 to 60 seconds and is then washed by flowing water A more preferable temperature of dipping processing is 10 to 40° C. and a more preferable dipping time is 2 to 20 seconds.

Alkali metal silicates used for the first aspect according to the present invention, for example, are sodium silicate, potassium silicate and lithium silicate. A aqueous solution of alkali metal silicate may contain an appropriate amount of sodium hydroxide, potassium hydroxide, lithium hydroxide or the like.

In addition, a aqueous solution of alkali metal silicates may contain alkaline-earth metal salts or 4th group (IVA group) metallic salts. As alkaline-earth metal salts, example are nitrates such as calcium nitrate, strontium nitrate, magnesium nitrate and barium nitrate; sulphate; hydrochloride; phosphate; acetate; oxalate; and borate. The 4th group (IVA group) metallic salts for example are titanium tetrachloride, titanium trichloride, potassium titanium fluoride, potassium titanium oxalate, titanium sulphate, titanium tetraiodide, zirconium chloride oxide, zirconium dioxide, zirconium oxychloride, and zirconium tetrachloride. These alkaline-earth metal salts and 4th group (IVA group) metallic salts can be used entirely independently or with two kinds or more thereof being combined.

An amount of Si adsorbed by an alkali metal silicate processing is measured by fluorescent X-ray analyzer and it is preferable that its adsorbed amount is approx. 1.0 to 15.0 $mg/m^2$.

An effect improving solvent resistance to an alkaline developer on the surface of a support for a lithographic printing plate can be obtained by this alkali metal silicate processing, elution of an aluminum component to a plate developer can be suppressed, thereby enabling reducing the generation of a developing scum resulting from the fatigue of the plate developer.

Next described is a support for a lithographic printing plate of the second aspect of the present invention.

A support for a lithographic printing plate of the second aspect of the present invention is obtained by subjecting an aluminum plate with an aluminum content of 95 to 99.4 wt % to at least graining treatment and anodizing treatment. It is preferable that the aluminum plate contains 1 wt % or more of at least one kind out of Al regenerated metal and a aluminum scrap as a material. As aluminum scrap, a used beverage can (UBC) or the like is preferable. A further cost reduction of materials can be realized by using such regenerated metals or scraps. It is preferable that the aforementioned graining treatment includes at least alkali etching treatment, electrolytic graining treatment and desmutting process, and the desmutting process includes at least alkali processing and acidizing processing using acid.

Hereinafter, a support for a lithographic printing plate of the second aspect according to the present invention will be explained while referring to a manufacturing method thereof or the like.

<Aluminum Plate (Rolled Aluminum)>

A content of aluminum in an aluminum plate used for the second aspect according to the present invention accounts for 95 to 99.4 wt %. Namely, it contains elements other than aluminum that accounts for 0.6 to 5 wt %. It is preferable that the trace elements contained in the aluminum alloys contain the later-described amounts of the later-described elements. It is preferable that unavoidable impurities of elements other than the elements described later are 0.06 wt % or less.

As aluminum alloys that can be used for a support for a lithographic printing plate of the second aspect according to the present invention, low-purity aluminum ingots such as scrap aluminum materials, secondary metals and regenerated metals that have been so far considered difficult to use can be taken up in place of an aluminum ingot with purity of 99.7 wt % or higher called a new metal. By use of a low-purity aluminum ingot as a material, a support for a lithographic printing can be manufactured at a lower cost than those of conventional methods.

A support for a lithographic printing plate of the second aspect according to the present invention uses an aluminum plate with an aluminum content (purity) of 95 to 99.4 wt %. If a purity is higher than 99.4 wt %, the allowable quantity of impurities decreases, thereby lessening a cost reduction effect. If the purity is less than 95 wt %, a defect such as cracking or the like during rolling may take place due to a large content of impurities. A more preferable aluminum purity is 95 to 99 wt % and a further preferable one is 95 to 97 wt %.

Fe: Fe is an element that is contained even in a new metal by a concentration of approx. 0.1 to 0.2 wt %. The content of Fe dissolved in aluminum is small and most of the contents remain as intermetallic compounds. Although Fe has an action to increase a mechanical strength, a cracking is likely to occur during rolling if the content is larger than 1.0 wt % and the content of 0.1 wt % or less is not practical. Typical intermetallic compounds are $Al_3Fe$, $Al_6Fe$, AlFeSi series compounds, AlFeSiMn series compounds or the like.

Si: Si is an element that is contained even in a new metal by a concentration of approx. 0.03 to 0.1 wt % and it is contained much also in Al scrap. Si exists in the condition that it is dissolved in aluminum, or as an intermetallic compound or a simple deposit. In addition, if Si is heated in the manufacturing process of a support for a lithographic printing plate, a dissolved Si may deposit as a simple Si. It is known that resistance to aggressive ink staining deteriorates if simple Si is excessive. Moreover, excessive Si affects the electrochemical graining properties. Typical intermetallic compounds are AlFeSi series compounds, AlFeSiMn system, $Mg_2Si$ or the like.

Cu: A trace of Cu is contained in new metal. It is an element that is contained much in scraps of JIS 2000 series and 4000 series materials in a large amount. Cu is rather likely to be dissolved in aluminum. Moreover, Cu is an element that largely affects electrochemical graining properties.

Mg: A trace of Mg is contained in new metal. In addition, Mg is an element that is contained much in scraps of JIS 2000 series, 3000 series, 5000 series and 7000 series materials. Since Mg is particularly contained much in can end materials, it is one of the major impure metals contained in scraps. Addition of Mg can improve heat dehardening resistance and mechanical strength. It is also known that Mg is rather likely to be dissolved in aluminum and intermetallic compounds thereof is formed with Si.

Mn: A trace of Mn is contained in new metal. Mn is an element that is contained more in scraps of JIS 3000 series materials. Since Mn is particularly contained more in can body material, it is one of the major impure metals contained in scraps. Mn is also rather likely to be dissolved in aluminum and intermetallic compounds thereof is formed with Al, Fe, Si or the like. Mn improves a mechanical strength and affects electrochemical graining properties.

Zn: A trace of Zn is contained in new metal. Zn is an element that is particularly contained much in scraps of JIS 7000 series. Zn is rather likely to be dissolved in aluminum and affects electrochemical graining properties.

Cr: A trace of Cr may be sometimes contained in new metal. In addition, Cr may be contained by a small amount in scraps of JIS 5000 series, 6000 series and 7000 series.

Ti: Ti is an element to be normally added as a crystal refinement material that account for 0.01 to 0.04 wt %. It is mainly added in the form of intermetallic compounds with Al or of $TiB_2$. A relatively large amount of Ti is contained in JIS 5000 series, 6000 series and 7000 series scraps as an impure metal. If Ti is excessively contained, it may affect electrochemical graining properties.

B: B may be added as a grain refiner with Ti, and 0.04 wt % or less of B may be contained.

When an element that is contained in an aluminum raw material and an element that is added to an aluminum molten metal are solidified in a casting process, a part of them is dissolved (intercrystallized) and the remaining exists as intermetallic compounds, or a simple crystallized one or a deposit. The percentage of the element that remains as intermetallic compounds, or independent crystallized one or deposit is largely affected by a solidifying rate, if, for example, a quick solidification is performed as in two-roll type continuous casting, most of the element is dissolved and if a solidifying rate is slow, such as in DC casting, the element is relatively likely to remain as intermetallic compounds, or a simple crystallized one or a deposit.

Thereafter, the element is dissolved again in aluminum or is converted into more stable intermetallic compounds during thermal processing such as soaking and annealing, or hot rolling. However, at a time when an ingot is prepared to be an aluminum plate for a lithographic printing plate of approx. 0.1 to 0.7 mm in thickness, the element often exists as intermetallic compounds, or a simple crystallized one or a deposit on the surface or inside of the plate.

<Manufacturing Method of a Support for a Lithographic Printing Plate>

A support for a lithographic printing plate of the second aspect according to the present invention is manufactured by, for example, preparing a web-like aluminum plate (hereinafter referred to as the "aluminum strip") composed of the aforementioned aluminum alloy and at least performing graining and anodizing treatments on the aluminum strip. Concretely, it is preferable that the graining treatment includes at least (1) a mechanical graining treatment and alkali etching treatment, (2) electrolytic graining treatment and (3) desmutting process. After the graining treatment is performed, (4) anodizing treatment (anodizing treatment process) is performed, thus a support for a lithographic printing plate is finally manufactured. In a graining treatment in the aforementioned processes (1) and (2), a mechanical graining treatment and anodizing treatment may both be performed or either one of them may be performed. In addition, this manufacturing process of a support for a lithographic printing plate may contain various types of processes other than a graining treatment and anodizing treatment.

In a practical aspect, an aluminum raw material is cast according to the normal method, then rolling and thermal processings are suitably performed to prepare an aluminum plate of 0.1 to 0.7 mm in thickness on which is performed a flatness correction as required. An aluminum plate for a lithographic printing plate thus manufactured is made to be an aluminum strip, on which each of the aforementioned processings (1) to (4) is continuously performed and the processed material is wound into a coiled status to manufacture a support for a lithographic printing plate.

<Surface Treatment of a Support for a Lithographic Printing Plate>

Described in order below are each treatment process in the manufacturing method of a support for a lithographic printing plate according to the second aspect of the present invention. Since the each processing as mentioned below is illustrated as an example, the second aspect of the present invention should not be limited to the descriptions of each process.

<A Mechanical Graining Treatment and Alkali Etching Treatment>

First, a mechanical graining treatment (a mechanical graining treatment process) is performed on an aluminum strip with brush graining using a pumice suspension. Thereafter, for the purposes of smoothing the surface irregularities of an aluminum strip and removing the particles of an abrasive remaining on the surface, an alkali etching treatment is performed on the surface of the alkali strap with an aqueous solution of alkali agent (alkali etching treatment). It is preferable that alkali agents used for alkali etching treatment are sodium hydroxide, potassium hydroxide, sodium metasilicate, sodium carbonate, sodium aluminate, sodium gluconate or the like. It is preferable that the concentration of an alkali agent in a aqueous solution is 0.01 to 30 wt %, a processing temperature is 60 to 80° C. to increase its productivity, the amount of an aluminum strip to be etched is 0.1 to 15 $g/m_2$. Further, a processing time should preferably be in a range of 2 seconds to 5 minutes corresponding to the amount of etching and a more preferable time of etching is 2 to 10 seconds to increase its productivity.

As the mechanical graining treatment is an optional one, it is acceptable that alkali etching treatment is performed dispensing with the mechanical graining treatment, then electrolytic graining treatment is directly performed on an aluminum strip and the next processing is then performed. In addition, it is acceptable that desmutting process with acid is performed in order to remove smut formed on the surface of an aluminum strip after alkali etching is performed.

<Electrolytic Graining Treatment>

In recent years, in many cases of the manufacturing process to manufacture a support for a lithographic printing plate from an aluminum strip, electrolytic graining treatment is performed on an aluminum strip using an electrolyte mainly composed of hydrochloric acid and nitric acid in order to improve a contact between a photosensitive layer on an image area formed on a lithographic printing plate and the surface of an aluminum strip and water holding property on a non-image area. This electrolytic graining treatment can be further performed on the surface of an aluminum strip obtained by a mechanical graining treatment such as the aforementioned brush graining treatment. Moreover, this processing can be directly performed after a pretreatment such as alkali washing is performed on the surface of an aluminum strip.

"Mainly composed of" here in this specification means that a principal acid or a principal alkali that is contained accounts for 30 wt % or higher, preferably 50 wt % or higher of an entire acid component in an acid solution or an entire alkalic component in an alkalic solution.

Electrolytic graining treatment is performed on an aluminum strip by conducting etching with AC as an electrolytic current applied in an electrolyte mainly composed of hydrochloric acid or nitric acid. It is preferable that the range of a frequency of AC electrolytic current is set at 0.1 to 100 Hz and is more preferable that it is set at 10 to 60 Hz. It is preferable that the concentration of an electrolyte is 3 to 150 g/L if either hydrochloric acid or nitric acid is mainly used as an electrolyte and is more preferable that it is 5 to 50 g/L.

It is preferable that the amount of aluminum dissolved in an electrolytic cell is 50 g/L or less and is more preferable that it is 2 to 20 g/L. Although various additives may be added to the electrolyte as required, it is necessary to suitably select such an additive since the addition makes it difficult to control the concentration of the electrolyte or the like if the aluminum strip is mass-produced.

It is preferable that the current density is 5 to 100 $A/dm^2$ and is more preferable that it is 10 to 80 $A/dm^2$. Furthermore, it is preferable that the waveform of an electrolytic current uses the specific AC waveform as described in JP 56-19280 B and JP 55-19191 B although it is suitably selected in accordance with a required quality, the component of an aluminum strip used or the like. The waveform of an electrolytic current and the conditions of an electrolyte as well as a supplied quantity of electricity per unit area of an aluminum strip are suitably selected in accordance with a required quality, the component of an aluminum strip used or the like.

<Desmutting Process>

Smut or intermetallic compounds exist on the surface of an aluminum strip on which electrolytic graining is performed. At this stage, a two-stage desmutting process (desmut treatment process) using a low-temperature acid solution is performed at least after an alkali processing (alkali treatment process) using an alkalic solution is performed in order to remove smut only.

First, smut is dissolved by treating an aluminum strip with an alkalic solution as an alkalic processing. It is preferable that an aluminum strip is treated with an alkalic solution at pH 10 or higher at the temperature of a solution of 25 to 80° C., and there are various alkalic solutions such as sodium hydroxide. In this case, it is more preferable that the temperature of an alkalic solution is 60 to 80° C. from the viewpoint of an increase in productivity. If the temperature of the solution is 60 to 80° C., an alkali processing on an aluminum strip can be completed in a very short time of 1 to 10 seconds. An alkali processing with this alkalic solution can adopt an immersion system, a shower system, application of an alkalic solution to an aluminum strip or the like.

In the next step, acidizing is performed on an aluminum strip with an acid solution (acidizing treatment process). It is preferable that an acid solution is one mainly composed of sulfuric acid. It is also preferable that a treatment equipment uses the equipment as described in Japanese Patent Application No. 2000-123805. The concentration of a solution (the concentration of an acid) is preferably 100 to 200 g/L. If the concentration of an acid is less than 100 g/L, an effect removing smut is small. In the meantime, if the concentration of an acid is higher than 200 g/L, it is not preferable since a contact between photosensitive layer and a support deteriorates because intermetallic compounds begin to be removed. A more preferable concentration of an acid is 120 to 190 g/L.

It is preferable that the temperature of an acid solution is 20 to 50° C. If the temperature is lower than 20° C., it is not preferable from the viewpoint of the equipment cost since a cooling equipment is required to control the temperature. If the temperature is higher than 50° C., it is not preferable since the removal of intermetallic compounds is accelerated, resulting in that a contact between photosensitive layer and a support deteriorates. Acidizing with an acid solution can generally adopt an immersion system, a shower system and application of an solution to an aluminum strip or the like. The aforementioned desmutting process enables the existence rate of intermetallic compounds on a support for a lithographic printing plate to be controlled to a predetermined one described later while removing the smut.

<Anodizing Treatment Process>

Anodizing treatment is performed on an aluminum strip after desmutting process is performed with an alkalic solution and acid solution as mentioned above (anodizing treatment process), whereby an anodized layer is formed on a surface area. The amount of an anodized layer formed should preferably be 0.1 to 10 g/m$^2$, and more preferably be 0.3 to 5 g/m$^2$. Although other conditions of anodizing treatment can not be definitely described since it is necessary to change their settings depending upon an electrolyte to be used (sulfuric acid, phosphoric acid, oxalic acid, chromic acid or the like), it is preferable that generally, the concentration of an acid (the concentration of an acid) is 1 to 80 wt %, the temperature of a solution is 5 to 70° C., the current density is 0.5 to 60 A/dm$^2$, the voltage is 1 to 100 V, and the electrolytic time is 1 second to 5 minutes.

An aluminum strip subjected to each treatment process mentioned above is wound into a coil-like form and a support for a lithographic printing plate is manufactured.

A hazardous smut on the surface of an aluminum strip can be removed by sequentially performing a predetermined alkali processing and acidizing as desmutting process prior to anodizing treatment according to the manufacturing method of a support for a lithographic printing plate as in the foregoing. At the same time the surface of an aluminum strip can be moderately grained by leaving the certain quantity of intermetallic compounds thereon. In the anodizing treatments thereafter, the generation of a defect on an anodized layer attributable to smut can be suppressed, moreover, a contact between a photosensitive layer and a support can be improved if a presensitized plate is prepared by further providing the photosensitive layer.

An anodized layer formed on an aluminum strip itself is stable and has an adequately high water wettability. Therefore, it is also possible to immediately apply a photosensitive material to the surface of the anodized layer to form a photosensitive layer and a surface treatment can be performed as required. Examples of the surface treatments are provision of a silicate layer with alkali metal silicate to the surface of an aluminum strip or an undercoated layer composed of a hydrophilic high molecular compounds or the like and so forth. It is preferable that the coated amount of an undercoated layer is 1 to 150 mg/m$^2$.

A presensitized plate is thus manufactured by arranging a photosensitive layer on the surface of a support for a lithographic printing plate, which is provided with an undercoated layer as required. In addition, a mat layer can be applied after the photosensitive layer is applied and dried.

Thus obtained presensitized plate is subjected to an image exposure, development processing or the like to be prepared as a lithographic printing plate and is set in a printing machine.

The foregoing method allows manufacturing of a support for a lithographic printing plate from a low-purity aluminum material such as aluminum scraps or the like, dispensing with a strict control over the alloy composition of an aluminum material as a raw material and a manufacturing process. If a presensitized plate is manufactured from a support for a lithographic printing plate like this, a contact between photosensitive layer and a support at the time of printing is excellent and press life can be improved.

<Intermetallic Compounds>

In a support for a lithographic printing plate of the second aspect of the present invention after graining treatment, preferably after anodizing treatment, an aluminum plate contains three kinds or more of intermetallic compounds, one kind or more thereof are intermetallic compounds consisting of two kinds of elements, and another one kind or more are intermetallic compounds consisting of four kinds of elements. Further, among the intermetallic compounds, the density of intermetallic compounds existing on the surface is 3,000 to 35,000 pcs/mm$^2$ and preferably 4,000 to 35,000 pcs/mm$^2$, and more preferably 4,500 to 30,000 pcs/mm$^2$. Since these intermetallic compounds play a role like a spike between a support and a photosensitive layer, improving a contact between them, thus an excellent press life can be obtained.

The intermetallic compounds give an anchoring effect between a support for a lithographic printing plate and an image recording layer and a contact between a support for a lithographic printing plate and an image recording layer can be improved, thus press life is improved. It is particularly preferable that, in order to improve a contact and thus press life, a plurality of kinds of intermetallic compounds, or intermetallic compounds in different forms are mixed. It is required that three kinds or more of intermetallic compounds are contained, and that one kind or more out of them are intermetallic compounds composed of two elements and another one kind or more are intermetallic compounds composed of four elements.

In addition, it is preferable that the diameter (grain diameter) of an intermetallic compound is 0.1 $\mu$m or more, and is preferably 0.2 to 2.0 $\mu$m. If the diameter (grain diameter) of intermetallic compounds is less than 0.1 $\mu$m, a contact with a photosensitive layer provided on the surface of a support for a lithographic printing plate may deteriorate.

By setting the kind and density of the intermetallic compounds in the above described range, the intermetallic compounds tend to serve as nuclei of recrystallization in the course of annealing and hot rolling during the manufacturing steps of aluminum plate. As a result, crystal structure is finer and an appearance of the support after the surface treatment is excellent.

The kind, diameter (grain diameter) and existence rate of intermetallic compounds can be controlled by changing the added amount of raw materials containing impurities such as low-purity scraps, for example, UBC material or secondary metal. Otherwise, they can be to some extent controlled by suitably changing the manufacturing conditions of a support for a lithographic printing plate. For example, they may be suitably changed within a predetermined range by lowering the processing temperature or the concentration of sulfuric acid or the like in the acidizing process in desmutting process so as to reduce the removal capacity of intermetallic compounds with an acid. If a density is required to decrease, a method of suitably removing them by chemical etching with hydrochloric acid can be also employed.

In addition, the kind and existence rate of intermetallic compounds can be easily calculated by observing a grained surface with SEM (scanning electron microscope) or the like and, for example, counting the number of the intermetallic compounds in a range of 60 $\mu$m×50 $\mu$m at 5 locations (n=5), which are converted into pcs/mm$^2$. The same method can be used for the measurement of a diameter.

Otherwise, they can be easily calculated by surface analyzing in a range of, for example, 170 $\mu$m×170 $\mu$m with EPMA (electronic probe microanalyzer) to specify the kind of intermetallic compounds, count its number and convert the number into pcs/mm$^2$.

Examples of intermetallic compounds consisting of two kinds of elements are $Al_3Fe$, $Al_6Fe$, $Mg_2Si$, $Ni_3Al$, $MnAl_6$, $TiAl_3$, $CuAl_2$ or the like. Examples of intermetallic compounds composed of three kinds of elements are α-AlFeSi, β-AlFeSi or the like. Further, examples of intermetallic compounds consisting of four kinds of elements are α-AlFeMnSi, β-AlFeMnSi or the like.

[A Presensitized Plate]

A presensitized plate according to the present invention is provided with an image recording layer on each of a support for a lithographic printing plate of the first aspect and that of the second aspect of the present invention. An image recording layer is not particularly limited, and for example, any of the below-mentioned image recording layers A to E is preferably used.

(1) Image Recording Layer A

Image recording layer A is a thermal positive image recording layer. Examples are image recording layers A-1 to A-3 below.

(1-1) Image Recording Layer A-1

A lithographic printing plate having image recording layer A-1 is obtained by sequentially providing an aluminum support obtained as above with an alkali-soluble intermediate layer and a photosensitive layer readily soluble in alkali by heating. Described below are an alkali-soluble intermediate layer and a photosensitive layer readily soluble in alkali by heating.

<Intermediate Layer>

An intermediate layer readily soluble in alkali in a presensitized plate according to the present invention is not particularly limited if it is a layer readily soluble in alkali. An intermediate layer, which contains a polymer having monomers with an acid group, is preferable and an intermediate layer which contains a polymer having monomers with onium group and monomers with acid group is more preferable.

<Photosensitive Layer>

A photosensitive layer readily soluble in alkali by heating in a presensitized plate according to the present invention contains a positive type photosensitive composition for infrared laser (hereinafter also referred to as merely a "photosensitive composition").

A positive type photosensitive composition for infrared laser contained in a photosensitive layer contains at least (A) a water-insoluble and alkali-soluble resin (hereinafter also referred to as an "alkali-soluble high molecular compound"), (B) a compound that lowers the solubility of the high molecular compound in an alkali aqueous solution by being mutually dissolved with the alkali-soluble high molecular compound, and that decreases the solubility lowering action thereof by heating, and (C) a compound that generates heat by absorbing light and further, if required, (D) other components.

(A) Alkali-Soluble High Molecular Compound

An alkali-soluble high molecular compound used for the present invention is not particularly limited, but can be those already known, for example, those having the acid group structures as below at a principal chain or a side chain of a high molecular compound.

Phenolic hydroxy group (—Ar—OH), carboxy group (—$CO_3$H), sulfo group (—$SO_3$H), phosphate group (—$OPO_3$H), sulfonamide group (—$SO_2$NH—R), substituted sulfonamide series acid group (active imide group) (—$SO_2$NHCOR, —$SO_2$NH$SO_2$R, —CONH$SO_2$R).

Ar here represents bivalent aryl group which may have a substituent and R represents hydrocarbon group which may have a substituent.

Examples of a high molecular compound having phenolic hydroxy group are novolak resin such as phenol formaldehyde resin, m-cresol formaldehyde resin, p-cresol formaldehyde resin, m-/p-mixed cresol formaldehyde resin and phenol/cresol (either of m-, p- and m-/p-mixed applicable) mixed formaldehyde resin, and pyrogallol acetone resin.

(B) A compound which Lowers the Solubility of the High Molecular Compound in an Alkali Aqueous Solution by Being Mutually Dissolved with the Alkali-Soluble High Molecular Compound, and which Decreases the Solubility Lowering Action by Heating As the preferable (B) components used for the present invention, there are for example, compounds such as sulfones, ammonium salts, phosphonium salts, and amides that interact with the aforementioned (A) components. (B) components should be suitably selected, taking into consideration an interaction with (A) components. Concretely, for example, cyanine dye A or the like is preferably used if novolak resin is independently used.

(C) A Compound that Generates Heat by Absorbing Light

A compound that generates heat by absorbing light in the present invention means one which has a light absorption region in the infrared region of 700 nm or more, preferably 750 to 1,200 nm and expresses photothermal conversion function in a light of a wavelength in this range. Concretely, various pigments or dyes that absorb the light in this wavelength band and generate heat can be used. Particularly, the aforementioned dye is preferable since image formation feature is excellent.

As the aforementioned pigments, marketed pigments or those as described in color index (C.I.) Handbook, "Latest Pigment Handbook" (Japan Association of Pigment Technology, 1977), "Latest Pigment Applications Technology" (CMC Publishing Co., Ltd., 1986) and "Printing Ink Technology" (CMC Publishing Co., Ltd., 1984) can be employed.

Examples of the aforementioned pigments include black pigments, yellow pigments, orange pigments, brown pigments, red pigments, purple pigments, blue pigments, green pigments, fluorescent pigments, metal powder pigments and polymer bonded pigments. Concretely, the following can be used; insoluble azo dyes, azo lake pigments, condensed azo pigments, chelated azo pigments, phthalocyanine series pigments, anthraquinone series pigments, perylene and perinone series pigments, thioindigo series pigments, quinacridone series pigments, dioxazine series pigments, isoindolinone series pigments, quinophthalone series pigments, dyed lake pigments, azine pigments, nitroso pigments, nitro pigments, natural pigments, fluorescent pigments, inorganic pigments and carbon black.

As the aforementioned pigment, commercially available pigments and the pigments which are already known as described in a reference (for example, "Dyes Handbook" compiled by Society of Synthetic Organic Chemistry, 1970) can be employed. Concretely, dyes such as azo dyes, metallic complex compound azo dyes, pyrazolone azo dyes, anthraquinone dyes, phthalocyanine dyes, carbonium dyes, quinone imine dyes, methine dyes, cyanine dyes or the like can be used.

It is particularly preferable that in this invention, pigments or dyes which absorb infrared rays or near infrared rays are suitable for lasers which irradiate infrared rays or near infrared rays, among these pigments or dyes.

(B+C) Component

In the present invention, it can also contain, in place of (B) a compound which decreases the solubility of the high molecular compound in an alkali aqueous solution by being mutually dissolved with the alkali-soluble high molecular compound and which decreases the solubility lowering action by heating and (C) a compound that generates heat by absorbing light, one compound which has characteristics of both compounds ((B+C) component).

(D) Other Components

Various additives can be further added to the photosensitive composition according to the present invention as required. For example, cyclic anhydrides, phenols, organic acids and sulfonic compounds can be simultaneously used in order to improve sensitivity.

(1-2) Image Recording Layer A-2

Image recording layer A-2 is a two-layer structure positive type thermosensitive layer which has a thermosensitive layer provided closer to the surface (exposure surface) and a lower layer containing an alkali-soluble resin provided closer to a support.

Both layers contain a water-insoluble and alkali-soluble resin, and the thermosensitive layer located at an upper area thereof contains a compound which absorbs light and generates heat. Described below is each constituent of this image recording layer A-2.

<Water-insoluble and Alkali-soluble Resin>

A water-insoluble and alkali-soluble resin used for the thermosensitive layer and the lower layer includes a homopolymer which contains an acid group at a principal chain and/or a side chain in a high molecule, copolymers thereof or a mixture thereof. Since a lower layer and a thermosensitive layer used in the present invention contain an alkali-soluble high molecular compound, they have characteristics to be dissolved if they contact with an alkaline developer.

The descriptions of a water-insoluble and alkali-soluble resin used for the lower layer and the thermosensitive layer, added quantities or the like thereof are the same as in those of "(A) an alkali-soluble high-molecular compound" used for the aforementioned image recording layer A-1.

Acrylic resin is preferable from the viewpoint of an image formation at the time of development as an alkali-soluble high-molecular compound used for a lower layer, since the resin can well hold the solubility of a lower layer to an alkaline developer mainly composed of an organic compound having a buffer action and a base.

In addition, a resin which has a phenolic hydroxy group is preferable as an alkali-soluble high-molecular compound used for the thermosensitive layer. This is because the image formation characteristic thereof is improved, in terms of that a strong hydrogen bonding is generated in an unexposed area, while a part of hydrogen bonding is easily released in an exposed area, and that a difference in development characteristics is large with respect to non-silicate developer between an unexposed area and an exposed area. Among the many, novolak resin is preferable.

<Compound that Generates Heat by Absorbing Light>

The description of a compound that generates heat by absorbing light used for a thermosensitive layer, its added quantity and the like are the same as in those of "(C) A compound that generates heat by absorbing light" used for the aforementioned image recording layer A-1.

A compound that generates heat by absorbing light can be added to not only the photosensitive layer but also to the lower layer. The lower layer can be also allowed to function as a photosensitive layer by adding the compound that generates heat by absorbing light in the lower layer. The compound that generates heat by absorbing light contained in a lower layer may be the same as, or different from a compound that generates heat by absorbing light contained in a thermosensitive layer.

In addition, the compounds that absorb light and generate heat may be added to the layer together with other components, or another layer may be provided and the compound may be added thereto. If another layer is provided, it is preferable that the compound is added to a layer adjacent to the thermosensitive layer.

In addition, although it is preferable that a compound that generates heat by absorbing light and an alkali-soluble high-molecular compound are contained in the same layer, it is also acceptable that they are contained in different layers.

<Other Components>

The lower layer and the thermosensitive layer can contain various additives other than aforementioned essential components as required in a range that does not impair the object of the present invention. An additive may be contained in a lower layer only, it may be contained in a thermosensitive layer only or it may be contained in both layers.

(1-3) Image Recording Layer A-3

An image recording layer A-3 contains cyanine dye and a water-insoluble and alkali-soluble resin. A presensitized plate having the image recording layer A-3 is obtained by, for example, dissolving a photosensitive composition containing these components in a solvent system containing 80% or more of a solvent whose boiling point is below 100° C. or applying a dispersed photosensitive coating solution to an aluminum support and allowing the plate to be dried to form a photosensitive layer.

The descriptions of a water-insoluble and alkali-soluble resin used for the image recording layer A-3, its added quantity or the like are the same as in those of "(A) alkali-soluble high-molecular compound" used for the aforementioned image recording layer A-1.

Although the image recording layer A-3 contains the aforementioned cyanine dye, the layer can also contain another compound that generates heat by absorbing light in a photosensitive layer (photothermal conversion agent) from the viewpoint of the improvement of sensitivity to exposure. The descriptions of another compound that generates heat by absorbing light, added quantity thereof and the like are the same as in those of "(C) Compound that generates heat by absorbing light" used for the aforementioned image recording layer A-1.

Various additives can be further added to the image recording layer A-3 as required. Examples of such additives include onium salts, aromatic sulfonic compounds, aromatic sulfonic ester compound, and multifunctional amine compounds.

In addition, cyclic anhydrides, phenols, organic acids can be simultaneously used in order to improve sensitivity.

(2) Image Recording Layer B

An image recording layer B is a thermal negative image recording layer. The example includes the following image recording layers B-1 and B-2.

(2-1) Image Recording Layer B-1

Image recording layer B-1 is an image recording material which is characterized by containing at least diazonium salts, infrared absorbents, cross-linking agents that cross-links by acids and binders.

In a presensitized plate which uses this image recording layer B-1, an energy given by a solid laser or a semiconductor laser which irradiates infrared rays is converted into a thermal energy by an infrared absorbent and an image is formed by allowing the diazonium salt to be decomposed by the heat. Namely, an acid that is produced by the decomposition of a diazonium salt accelerates a cross-linking reaction between a cross-linking agent that cross-links by an acid and a binder, whereby the plate making of an image recording, that is a recording material, is performed. Particularly, an image recording material that is excellent in stability in storage can be provided by using a diazonium salt.

The descriptions of an infrared absorbent (a compound that generates heat by absorbing light) used for an image recording layer B-1, its added quantity and the like are the same as in those of "(C) A compound that generates heat by absorbing light" used for the aforementioned image recording layer A-1.

As cross-linking agents that cross-link by an acid (called as "acid cross-linking agent" or merely as a "cross-linking agent") used for the image recording layer B-1, include, for example, (i) Aromatic compounds which are substituted by a alkoxymethyl group or hydroxymethyl group, (ii) Compound which has N-hydroxymethyl group or N-acyloxymethyl group and (iii) epoxy compounds.

Examples of a binder used for the image recording layer B-1 include novolak resin and polymer which has hydroxy aryl group at a side chain.

In addition, as a binder, a polymer which has hydroxy aryl group at a side chain is preferably illustrated.

Various compounds other than these compounds may be added to the image recording layer B-1 if necessary. For example, a dye which has a large absorption capability in a visible light area can be used as an image coloring agent.

(2-2) Image Recording Layer B-2

Image recording layer B-2 contains a compound that controls coefficient of static friction on the surface at a low level.

Described below is one aspect with a concrete example.

In this aspect, a compound is used that contains (A) a radical generator, (B) a radical polymeric compound and (D) a compound that is expressed by the following general formula (1) as the image recording layer B-2.

$R^1—X$ general formula (1)

(wherein, $R^1$ shows a hydrocarbon group of total carbon number of 8 to 32 which may have a substituent. X shows $—CO—Y—R^2$, $—Y—CO—R^2$, $—NH—CO—Y—R^2$, $—O—CO—NH—R^2$, $—NH—CO—NH—R^2$, $—SO_2—Y—R^2$, $—Y—SO_2—R^2$, $—O—SO_2—R^2$, $—CO—O—CO—R^2$ or $—Y—R^3$. is $—Y—R^3$, Y is not a single bond. In addition, $R^2$, $R^3$ and $R^4$ are independent and show a hydrocarbon group of total carbon number of 20 or less which may have hydrogen atom and substituent.)

A negative type image recording layer B-2 of the aspect contains (A) a radical generator (radical polymerization initiator) and (B) a radical polymeric compound which initiates polymerization by the generated radical to be hardened as well as the aforementioned (D). Preferably, the layer further contains (C) an infrared-ray absorbent and (E) a binder polymer. In this image recording layer, (A) a radical polymerization initiator such as onium salts is decomposed by heat in a heated area or exposed area to generate a radical. (B) a radical polymeric compound has at least one ethylene-unsaturated double bond and is selected from compounds which have at least one, preferably two or more of end ethylenic-unsaturated bonds, and a polymerization reaction is continuously occurred by the generated radical and an image area is formed by hardening.

Described below is the constituent of other image recording layers.

(A) A Radical Generator will be Described.

Examples of onium salts are included as a radical generator which is preferably used for the present invention. Concretely, iodonium salts, diazonium salts and sulfonium salts are included. Although these onium salts also have a function as an acid generator, these salts function as an initiator of a radical polymerization when these salts are used together with a radical polymeric compound described later.

(B) A Radical Polymeric Compound will be Described.

A radical polymeric compound used for the image recording layer B-2 is a radical polymeric compound which has at least one ethylene-unsaturated double bond and is selected from compounds which have at least one, preferably two or more of end ethylenic-unsaturated bonds. Since these groups of compounds are widely known in the fields of this industry, they can be used without particular limitation in the present invention.

(C) A Light Absorbent will be Described.

Since the present invention forms an image by sensing ultraviolet rays, visible light or infrared rays, it is preferable that a light absorbent is contained in an image recording layer. A light absorbent used for the present invention is a compound that absorbs ultraviolet rays, visible light or infrared rays and a radical is produced by combining it with a radical generator.

If recording on the image recording layer of an image recording material of the present invention is done by a laser irradiating infrared rays, it is preferable from the viewpoint of improvement of sensitivity to add a light absorbent that has a function to convert infrared rays used for exposure into heat. These light absorbents include pigments and dyes as described in "(C) a compound that generates heat by absorbing light" used for the aforementioned image recording layer A-1.

Examples of particularly preferable dyes out of them include cyanine dyes, sauarvlium dyes, pyryliums salts, nickel thiolate complex. Among these, cyanine dye is preferable.

In the present invention, a concrete example of cyanine dye that can be used preferably includes dyes as described in the paragraph numbers [0017] to [0019] in JP 2001-133969 A.

(E) A Binder Polymer will be Described.

In the present invention, it is preferable that a binder polymer is further added to the image recording layer B-2 from the viewpoint of the improvement of film characteristics. It is preferable that a linear organic polymer is used as a binder. Any of the above may be used as the "linear organic polymer". A linear organic polymer which is soluble or swellable to water or a weak alkali aqueous solution is selected in order to preferably allow a development processing in water or a development processing in a weak alkali aqueous solution to be materialized. A linear organic polymer is selected for use in accordance with applications not only as a film forming agent to form an image recording layer but also as a developer of the water, a weak alkali aqueous solution or an organic solvent development. For example, if a water-soluble organic polymer is used, a development processing in water is realized. Examples of these linear organic polymers include a radical polymer which has a carboxy group at a side chain, for example, those as described in JP 59-44615 A, JP 54-34327 B, JP 58-12577 B, JP 54-25957 B, JP 54-92723 A, JP 59-53836 A and JP 59-71048 A, that is, methacrylate copolymer, acrylate copolymer, itaconate copolymer, crotonate copolymer, maleate copolymer and partially esterified maleate copolymer or the like. Moreover, similarly, an example includes acid cellulose derivatives which have a carboxy group at a side chain. In addition, a binder in which a cyclic anhydride is added to a polymer having a hydroxy group or the like is useful.

Other components will be described.

In the present invention, various compounds other than these compounds may be further added as required. For example, a dye that has a large absorption capability in a visible light area can be used as an image coloring agent. Moreover, pigments such as phthalocyanine system pigments, azo system pigments, carbon black and titanium oxide can be preferably used.

(3) Image Recording Layer C

An image recording layer C is a photo polymer image recording layer. Examples include the following image recording layers C-1, C-2 and C-3.

(3-1) Image Recording Layers C-1 and C-2

Although the image recording layers C-1 and C-2 are not particularly limited, it is a negative type photo polymerization type photosensitive layer that is recordable with a laser.

The major components of a photo polymerization type photosensitive layer are (a) a compound which has an addition polymerizable ethylenic-unsaturated double bond, (b) a high molecular compound which is soluble or swellable in an alkali aqueous solution and (c) a photopolymerization initiator system. Various compounds such as a coloring agent, a plasticizer and a thermal polymerization inhibitor are added as required.

A compound which contains an addition polymerizable ethylene-double bond can be arbitrarily selected from compounds having at least one, preferably two or more end ethylenic-unsaturated bonds. These compounds, for example, are monomers, prepolymers (that is, dimers, trimers and oligomers), their mixtures, and compounds in chemical forms such as their copolymers. Examples of monomers and their copolymers include unsaturated carboxylic acid (for example, acrylic acid, methacrylic acid, itaconic acid, crotonic acid, isocrotonic acid, maleic acid) and their esters and amides, they include more preferably esters of unsaturated carboxylic acids and aliphatic polyalcohol compounds and amides of unsaturated carboxylic acids and aliphatic polyamine compounds.

A high-molecular polymer which is soluble or swellable in an alkali aqueous solution contained in the photosensitive layer of a photosensitive lithographic printing plate used for the present invention is selected not only as the film forming agent of the composition but also in accordance with applications of an alkali water development agent. In case of an organic high-molecular polymer, a water development processing may be realized if a water-soluble organic high-molecular polymer is used.

A photopolymerization initiator contained in the image recording layers C-1 and C-2 can be suitably selected for use from various photopolymerization initiators already known in patents, references or the like, or from two kinds or more of photopolymerization initiators which are used simultaneously (a photopolymerization initiation system) depending on the wavelength of light source.

Moreover, in the present invention, it is preferable that a small quantity of a thermal polymerization inhibitor is added to the aforementioned basic components in order to prevent the undesirable and unnecessary thermal polymerization of a polymerizable ethylene-unsaturated compound under manufacture or storage of a photosensitive composition for a photosensitive layer. Examples of proper thermal polymerization inhibitors include hydroquinone, p-methoxyphenol, di-t-butyl-p-cresol, pyrogallol, t-butylcatechol, benzoquinone, 4,4'-thiobis (3-methyl-6-t-butylphenol), 2,2'-methylenebis (4-methyl-6-t-butylphenol, N-nitrosophenylhydroxylamine cerous salts, N-nitrosohydroxylamine aluminum salts or the like.

Image recording layer C-3 used for the present invention is mainly composed of a compound having at least one ethylene-unsaturated bond which can be polymerized with active rays, a linear organic polymer and a photopolymerization initiator and contains as necessary various compounds such as an organic high-molecular binder, a thermal polymerization inhibitor, a coloring agent and a plasticizer.

The descriptions of a compound having at least one ethylene-unsaturated bond which may be polymerized with active rays and its quantity or the like are the same as in those of a compound containing an addition polymerizable ethylene-double bond used for the aforementioned image recording layers C-1 and C-2.

As a photopolymerization initiator, various photopolymerization initiators already known in patents, references or the like, or combination of two kinds or more of photopolymerization initiators (a photopolymerization initiation system) can be suitably selected and used depending on a wavelength of light source used. The same initiators as those used for image recording layers C-1 and C-2 as aforementioned can be used in the same quantity as in the image forming layers C-1 and C-2 cases.

Although a photopolymeric composition normally contains a linear organic polymer as a binder, any of polymers may be used as long as it is a linear organic polymer having a compatibility with a photopolymerizable ethylenic-unsaturated compound. Preferably, the linear organic polymer soluble or swellable in water or a weak alkali aqueous solution which may perform a water development processing or a weak alkali aqueous solution development processing is selected. The linear organic polymer is selected and used in accordance with applications not only as the film forming agent of the composition but also as a developer in the water, weak alkali aqueous solution or organic solvent development. For example, if a water-soluble organic high molecular polymer is used, a water development processing may be realized. As these linear organic polymers, the same organic high molecular polymers as those used for the image recording layers C-1 and C-2 as aforementioned can be used.

As for an acid cellulose derivative having carboxy group at a side chain, a polymer having hydroxy group added with a cyclic anhydride, a water-soluble linear organic polymer or the like, the same composition as those used for the aforementioned image recording layers C-1 and C-2 can be used in the same quantity as in the image recording layers C-1 and C-2 cases.

In addition, as for a thermal polymerization inhibitor, a higher fatty acid derivative, a coloring agent, various additives or the like, the same compound as those used for the aforementioned image recording layers C-1 and C-2 can be used in the same quantity as in the image recording layers C-1 and C-2 cases.

An oxygen blocking layer may be provided with a polymer oxygen blocking layer excellent in oxygen blocking feature such as, for example, polyvinyl alcohol, especially polyvinyl alcohol of saponification value 85% or higher and an acid celluloses on the photo polymeric photosensitive layer thus formed on the support in order to further prevent a polymerization inhibition action caused by oxygen contained in the air. The application methods of an oxygen blocking layer like this are in detail described, for example, in U.S. Pat. No. 3,458,311 and JP 55-49729 A.

(4) Image Recording Layer D

An image recording layer D is a conventional type positive image recording layer, that is, an analog type positive image recording layer.

As a photosensitive composition used for the image recording layer D utilized in the present invention, a positive type composition mainly composed of o-quinonediazide compound is used. An electrophotographic photosensitive layer as described in JP 37-17172 B, JP 38-6961 B, JP 56-107246 A, JP 60-254142 A, JP 59-36259 B, JP 59-25217 B, JP 56-146145 A, JP 62-194257 A, JP 57-147656 A, JP 58-100862 A, JP 57-161863 A or the like can be also used. As a photo polymeric compound mainly composed of a monomer containing an unsaturated double bond out of the aforementioned photosensitive compounds, for example, the compositions composed of addition polymeric unsaturated compounds having two or more end ethylene groups and photopolymerization initiators as described in U.S. Pat. No. 2,760,863, U.S. Pat. No. 3,060,023 and JP 59-53836 A can be used.

Although o-quinone diazide compound can even independently constitute a photosensitive layer, it is preferable that an alkali aqueous solution-soluble resin is simultaneously used as a binder. As an alkali aqueous solution-soluble resin like this, novolak resin is an example. Further, the examples include phenol formaldehyde resin, o-, m- or p-cresol formaldehyde resin, m-/p-mixed cresol formaldehyde resin, phenol/cresol (either of o-, m-, p-, m/p-mixed and o/m-mixed one may be used) mixed formaldehyde resin or the like. Phenol modified xylene resin, polyhydroxy styrene, polyhalogenated hydroxy styrene and acrylic series resin having phenolic hydroxy group as described in JP 51-34711 A can be also used.

A photosensitive composition in the present invention may contain cyclic anhydrides, phenols and organic acids in order to further improve sensitivity.

A nonionic surface active agent as described in JP 62-251740 A and an ampholytic surface active agent as described in JP 59-121044 A and JP 4-13149 A can be added to a photosensitive composition in the present invention in order to expand the range of the development conditions in which development can be processed stably (so-called development latitude).

(5) Image Recording Layer E

An image recording layer E is a conventional type negative image recording layer, that is, an analog type negative image recording layer.

The photosensitive composition of an image recording layer E used for the present invention will be described in detail. Diazo resin used for this photosensitive composition is diazo resin represented by a condensate of aromatic diazonium salt and a compound containing an active carbonyl group, for example, formaldehyde. Examples of the aforementioned diazo resins include organic solvent soluble diazo resin inorganic salts which is a reaction product of a hexafluorophosphate or tetrafluoroborate with a condensate of p-diazophenylamines and aldehydes such as formaldehyde and acetaldehyde, sulfonates with the aforementioned condensate as described in JP 47-1167 B, for example, organic solvent soluble diazo resin organic salts which is a reaction product with p-toluene sulfonic acid, propylnaphthalenesulfonic acid, butylnaphthalenesulfonic acid, dibutylnaphthalenesulfonic acid, dodecylbenzenesulfonic acid and 2-hydroxy-4-methoxybenzophenon-5-sulfonic acid. Particularly, a high molecular diazo compound containing hexamer or more in 20 mol % or more as described in JP 59-78340 A is preferable. In addition, mesitvlenesulfonate obtained by condensing 3-methoxy-4-diazo-diphenylamine with 4,4'-bis-methoxy-methyl-diphenylether as described in JP 58-27141 A or the like is used properly. Moreover, cocondensed diazo resin with aromatic compounds as described in JP 49-48001 B and cocondensed diazo resin with aromatic compounds having an acid group as described in JP 2-29650 A are preferably used. Diazo resin condensed with an aldehyde having an acid group or acetal compounds as described in JP 4-18559 A can be preferably used as well. Furthermore, aromatic compounds having at least one organic group out of the group consisting of carboxy group, sulfonic acid group, sulfin group, oxyacid group of phosphor and hydroxy group, diazonium compounds and preferably cocondensate containing aromatic diazonium compounds as a structural unit are preferable. In addition, the aforementioned diazo resins may be used independently or a mixture of two kinds or more may be used, It is preferable that diazo resin of 1 to 70 wt %, particularly 3 to 60 wt % is contained in the photosensitive layer as a whole.

A photo polymeric composition in the present invention contains a polymerizable compound having ethylene-unsaturated bond, a photopolymerization initiator and a high-molecular compound as essential components. The polymerizable compound having ethylene-unsaturated bond refers to a compound that has at least one ethylene-unsaturated bond in its chemical structure, having chemical forms such as, for example, monomer, prepolymer (that is, dimer, trimer and oligomer), the mixture thereof and copolymers thereof. Examples of them include unsaturated carboxylic acid and its salts, esthef ester of unsaturated carboxylic acid and aliphatic polyalcohol, amide of unsaturated carboxylic acid and aliphatic polyamine compound or the like.

It is preferable that a thermal polymerization inhibitor is further added to a photosensitive layer besides the aforementioned. As a thermal polymerization inhibitor, examples include hydroquinone, p-methoxyphenol, di-t-butyl-o-cresol, pyrogallol, t-butylcatechol, benzoquinone, 4,4'-thiobis (3-methyl-6-t-butylphenol), 2,2'-methylenebis (4-methyl-6-t-butylphenol) and 2-mercaptobenzimidazole.

Moreover, a dye or a pigment for the purpose of coloring a photosensitive layer, pH indicator as a printing-out agent, a fluorine system surface active agent or cellulose alkylether or the like for improving coating properties can be added.

In addition, a wax agent can be added in order to prevent a polymerization inhibition action caused by oxygen in the air. An agent that is a solid at an normal temperature and is dissolved in a coating solution and deposits on a surface during an application and drying process that is used as a wax agent. Examples include higher fatty acid such as stearic acid and behenic acid, higher fatty acid amides such as amidostearate and amidobehenate.

A protective layer composed of a polymer excellent in oxygen blocking characteristics such as, for example, polyvinyl alcohol and acid celluloses may be provided in order to completely prevent a polymerization inhibition action caused by oxygen in the air. The coating methods of a protective layer like this for example are in detail described in U.S. Pat. No. 3,458,311 and JP 55-49729 B.

(Development and Post-treatment)

A lithographic printing plate obtained by performing a development processing on a presensitized plate with a plate developer is subjected to a post-treatment with a rinse solution containing a washing water, surface active agent or the like and a finisher or a protective rubber solution mainly composed of gum arabic or a starch derivative or the like. For the post-treatment of a lithographic printing plate according to the present invention, various combinations of these post-treatments can be used. In recent years, an automatic developing machine for a presensitized plate has been widely used in order to rationalize and standardize plate-making working in the plate making and printing industry. This automatic developing machine generally includes a developing portion and a post-treatment portion, provided with equipment transferring a presensitized plate, each processing solution tank and a spraying equipment; a development processing and a post-treatment are performed by spraying each processing solution pumped up by a pump over presensitized plates from spray nozzles while presensitized plates after exposed are horizontally transferred. There are recently known a method of development processing where a presensitized plate is soaked and is transferred by a guide roll or the like in a processing solution tank filled with a processing solution and a method where a specified small quantity of washing water is supplied to wash the surface of a plate after developed and its waste-water is recycled as the dilution water of a plate developer undiluted solution. In these automatic processings, each processing can be performed while charging each replenishing solution to each processing solution in accordance with each processing quantity, operating time or the like. In addition, a so-called disposable processing method which processes an object with a substantially unused processing solution can be also applied thereto. A lithographic printing plate thus obtained by these processings is subjected to an off-set printing machine and is used for multi-printing.

EXAMPLES

Although the following examples in detail describe the present invention, the present invention shall not be limited to these examples.

<Example of the First Aspect According to the Present Invention>

Examples 1—1 to 1–98 and Comparative Examples 1—1 to 1–4

1. Manufacture of a Presensitized Plate

As shown in Table 1, each graining treatment (including an alkali etching treatment or desmutting process in addition to the graining treatment) to be described later was performed on each aluminum plate (Al plate) shown in Table 2. In addition, after an anodizing treatment was performed according to the method to be described later, a interface treatment was performed according to the method to be described later to obtain each support for a lithographic printing plate.

Subsequently, each support for a lithographic printing plate was provided with each image recording layer as shown in Table 1 to obtain each presensitized plate.

Moreover, an aluminum plate shown in Table 2 was obtained by adding the predetermined quantity of a predetermined specific trace element to a base Al alloy of the composition shown in Table 3.

(1) Graining Treatment

Each graining treatment will be described.

1) Graining Treatment 1

Graining treatment 1 was performed by continuously performing each kind of treatment listed in treatments (a) to (f). In addition, after each treatment was performed, water washing was performed by spraying and solution squeezing was performed by a nip roller after each processing and water washing was performed.

(a) Mechanical Graining Treatment

A mechanical gralning treatment was performed with a rotating roller-like nylon brush while supplying the suspension of an abrasive and water with specific gravity 1.12 as a polishing slurry liquid to the surface of an aluminum plate using equipment as shown in FIG. 1. As shown in FIG. 1, denotes an aluminum plate, 2 and 4 denote roller-like brushes, 3 denotes a polishing slurry solution, 5, 6, 7 and 8 denote support rollers. As the abrasive, a pumice that was crushed and was so classified as to be the mean diameter of a particle of, 40 μm was used. Mohs hardness of the abrasive was 5. The abrasive is composed of $SiO_2$ 73 wt %, $Al_2O_3$ 14 wt %, $Fe_2O_3$ 1.2 wt %, CaO 1.34 wt %, MgO 0.3 wt %, $K_2O$ 2.6 wt % and $Na_2O$ 2.7 wt %.

As a nylon brush, No.3 brush was used, whose material was 6·10 nylon and the brush length was 50 mm. Holes were arranged on a diameter ϕ300 mm stainless steel cylinder, to which nylon brushes were densely implanted. Three rotating brushes were used. A distance between two support rollers (of ϕ200 mm) at a lower section of the brush was 300 mm. A brush roller was controlled for the load of a drive motor for rotating a brush against a load before the brush was pressed to an aluminum plate, and was pressed onto the aluminum plate so as the arithmetical mean roughness ($R_a$)

of an aluminum plate after a mechanical graining treatment was performed to be 0.45 to 0.55 μm. The rotating direction of the brush was the same as the moving direction of the aluminum plate.

(b) Alkali Etching Treatment

Etching treatment was performed on an aluminum plate by spraying a aqueous solution (the temperature of the solution: 70° C.) of sodium hydroxide with the concentration of 27 wt % and aluminum ion with the concentration of 6.5 wt % from a spray tube to the aluminum plate. The amount of dissolved aluminum plate at the side on which grain ing treatment was to be electrochemically performed in a later process was 10 g/m$^2$.

(c) Desmutting Process

Next, desmutting process was performed with a nitric acid aqueous solution. As the nitric acid aqueous solution used for desmutting process, a waste solution of nitric acid used for an electrochemical graining in the next process was utilized. The temperature of the solution was 35° C. Desmutting process was performed by spraying this desmut solution with a spray for 2 seconds.

(d) Electrochemical Graining Treatment

The treatment used an electrolyte in which the concentration of an aluminum ion was controlled at 5 g/L by adding aluminum nitrate to an aqueous solution with the concentration of nitric acid of 9.5 g/L at the temperature of 50° C.

An electrochemical graining treatment was performed with a power supply generating a trapezoidal wave AC. The frequency of AC was 60 Hz and the time Tp to reach a peak from the current zero was 0.8 msec. The duty (ta/T) of AC was 0.5.

The current density was 60 A/dm$^2$ when the peak of AC was at the time of anode reaction of an aluminum plate and the ratio of the total quantity of electricity at the time of anode reaction of an aluminum plate to that at the time of cathode reaction of the aluminum plate was 0.95. The quantity of electricity applied to an aluminum plate was 180 C/dm$^2$ expressed by the total quantity of electricity at the time of anode reaction of the aluminum plate.

(e) Alkali Etching Treatment

Etching treatment was performed on an aluminum plate by spraying an aqueous solution (the temperature of the solution: 45° C.) with the concentration of sodium hydroxide 27 wt % and the concentration of aluminum ion 6.5 wt % from a spray tube to an aluminum plate. The amount of dissolved aluminum plate at the side on which graining treatment was to be electrochemically performed in a later process was 0.8 g/m$^2$.

(f) Desmutting Process Desmutting process was performed with an aqueous solution (the temperature of the solution: 60° C.) with the concentration of sulfuric acid 170 g/L and the concentration of aluminum ion 5 g/L for 4 seconds. As the sulfuric acid aqueous solution used for the desmutting process, a waste solution from an anodizing treatment process was utilized.

2) Graining Treatment 2

Graining treatment 2 was performed in the order of treatments (g) and (h) mentioned below in place of the treatments (c) and (d) mentioned above with the same method as in graining treatment 1 except that the amount of dissolved aluminum plate was set to be 0.2 g/m$^2$ in the aforementioned treatment (e) and that the temperature of the solution was 35° C. in the aforementioned process (f).

(g) Desmutting Process

Desmutting process was performed with a hydrochloric acid aqueous solution. As the hydrochloric acid aqueous solution used for desmutting process, a waste solution of hydrochloric acid used for an electrochemical graining in the next process was utilized. The temperature of the solution was 45° C. Desmutting process was performed by spraying this desmut solution with a spray for 2 seconds.

(h) Electrochemical Graining Treatment

The treatment used an electrolyte in which aluminum chloride was added to an aqueous solution with the concentration of hydrochloric acid 7.5 g/L at the temperature of 45° C. to adjust the concentration of aluminum ion at 5 g/L.

An electrochemical graining treatment was performed with a power supply generating a trapezoidal wave AC. The frequency of AC was 60 Hz and the time Tp to reach a peak from the current zero was 0.8 msec. The duty (ta/T) of AC was 0.5.

The current density was 50 A/dm$^2$ when the peak of AC was at the time of anode reaction of an aluminum plate, and the ratio of the total quantity of electricity at the time of anode reaction of an aluminum plate to that at the time of cathode reaction of the aluminum plate was 0.95. The quantity of electricity applied to the aluminum plate was 50 C/dm$^2$ expressed by the total quantity of electricity at the time of anode reaction of the aluminum plate.

3) Graining Treatment 3

Graining treatment 3 was performed by continuously performing each kind of processing listed in treatments (i) to (m). In addition, after each processing was performed, water washing was performed by spraying, and solution squeezing was also performed by a nip roller after each processing and water washing are performed.

(i) Alkali Etching Treatment

Etching treatment was performed on an aluminum plate by spraying an aqueous solution (the temperature of the solution: 70° C.) with the concentration of sodium hydroxide 27 wt % and the concentration of aluminum ion 6.5 wt % from a spray tube to an aluminum plate. The amount of the aluminum dissolved at the side on which graining treatment was to be electrochemically performed in a later process was 6 g/m$^2$.

(j) Desmutting Process

Next, desmutting process was performed with a nitric acid aqueous solution. As the nitric acid aqueous solution used for desmutting process, a waste solution of nitric acid used for an electrochemical graining in the next process was utilized. The temperature of the solution was 45° C. Desmutting process was performed by spraying this desmut solution with a spray for 2 seconds.

(k) Electrochemical Graining Treatment

The treatment used an electrolyte in which aluminum nitrate was added to an aqueous solution with the concentration of nitric acid 10.5 g/L at the temperature of 50° C. to adjust the concentration of aluminum ion at 5 g/L.

An electrochemical graining treatment was performed with a power supply generating a trapezoidal wave AC. The frequency of AC was 60 Hz and the time Tp to reach a peak from the current zero was 1.5 msec. The duty (ta/T) of AC was 0.5.

The current density was 50 A/dm$^2$ when the peak of AC was at the time of anode reaction of an aluminum plate and the ratio of the total quantity of electricity at the time of anode reaction of an aluminum plate to that at the time of cathode reaction of the aluminum plate was 0.95. The quantity of electricity applied to an aluminum plate was 220 C/dm$^2$ expressed by the total quantity of electricity at the time of anode reaction of the aluminum plate.

(1) Alkali Etching Treatment

Etching treatment was performed on an aluminum plate by spraying an aqueous solution (the temperature of the solution: 45° C.) with the concentration of sodium hydroxide 27 wt % and the concentration of aluminum ion 6.5 wt % from a spray tube to an aluminum plate. The amount of the aluminum dissolved at the side on which graining treatment was to be electrochemically performed in a later process was 0.2 g/$m^2$.

(m) Desmutting Process

Desmutting process was performed with an aqueous solution (the temperature of the solution: 35° C.) with the concentration of sulfuric acid 100 g/L and the concentration of aluminum ion 5 g/L for 4 seconds. As the sulfuric acid aqueous solution used for the desmutting process, a waste solution from an anodizing treatment process was utilized.

(2) Anodizing Treatment

An anodized layer was provided by performing a DC electrolysis so as to allow an current density to be 25 A/$dm^2$ in a sulfuric acid solution with the concentration of 170 g/L at the temperature of 35° C. In this case, a power supplying time was controlled to allow an anodized layer to be 2.5 g/$m^2$.

(3) Interface Treatment

As a interface treatment, a silicate treatment was performed and an undercoat layer was formed. "Silicate+Undercoating" described in Table 1 means that "an undercoat layer was formed after silicate treatment was performed," and "an Undercoating" means that "an undercoat layer was formed dispensing with silicate treatment. Each processing is described below.

1) Silicate Treatment

An alkali-metal silicate treatment (silicate treatment) was performed by dipping an aluminum support in the processing bath of a 1 wt % of No.3 sodium silicate aqueous solution at the temperature of 30° C. for 10 seconds. Thereafter, water washing was performed by spraying well water with a spray.

2) Formation of Undercoat Layer

Different undercoat layers were provided corresponding to kinds of image recording layers. The formation of the undercoat layers is described in each image recording layer.

(4) Image Recording Layer (i) Image Recording Layer A-1

(a) Formation of Undercoat Layer

An undercoat solution composed of the following composition was applied to an aluminum support and a layer was formed by drying the support at 80° C. for 15 seconds. The covered quantity of a layer after drying was 15 mg/$m^2$.

<Composition of Undercoat Solution>

The following high-molecular compound: 0.3 g

Methanol: 100 g

Water: 1 g

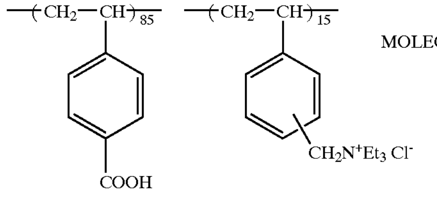

MOLECULAR WEIGHT 28,000

(b) Formation of Photosensitive Layer

Furthermore, a photosensitive coating solution 1 composed of the following composition was prepared and this photosensitive coating solution 1 was applied to an undercoated aluminum support with a bar coater such that an applied quantity after drying (the applied quantity of a photosensitive layer) was 1.0 g/$m^2$, and a photosensitive layer was formed by drying the support to obtain a presensitized plate.

<Composition of Photosensitive Coating Solution 1>

Capric acid: 0.03 g

Specified copolymer 1 to be described later: 0.75 g m, p-cresol novolak resin (ratio of m/p=6/4, weight average molecular weight 3,500, unreacted cresol 0.5 wt % contained): 0.25 g p-toluenesulfonic acid: 0.003 g tetrahydrophthalic anhydride: 0.03 g cyanine dye A expressed by the following structural formula: 0.017 g

CYANINE DYE A

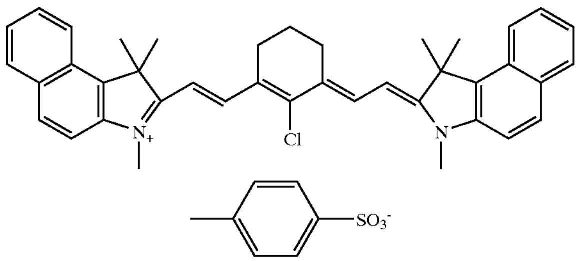

Dye formed by converting a counter ion of Victoria pure blue BOH into 1-naphthalenesulfonate anion: 0.015 g Fluorine-containing surfactant (MEGAFACE F-177 made by Dainippon Ink And Chemicals, Incorporated): 0.05 g methylethylkeone: 10 g γ-butyrolactone: 10 g methylethylkeone: 10 g 1-methoxy-2-propanol: 1 g <Specified Copolymer 1>

Methacrylic acid 31.0 g (0.36 mol), ethyl chloroformate 39.1 g (0.36 mol) and acetonitrile 200 mL were charged into a 500 mL three-spout flask provided with an agitator, a cooling tube and a dripping route, and a mixture was agitated while cooling the flask with an ice water bath. Triethylamine 36.4 g (0.36 mol) was dripped into the mixture for about one hour with a dripping route. After completing the dripping, the ice water bath was removed and the mixture was agitated at a room temperature for 30 minutes.

p-aminobenzenesulfonamide 51.7 g (0.30 mol) was added to the reaction mixture, and the mixture was agitated for one hour while it was kept hot at 70° C. with an oil bath. After completing the reaction, the mixture was charged into a 1 L water while the water was agitated, and the thus obtained mixture was agitated for 30 minutes. This mixture was filtered to take out a deposit and after the deposit was diluted with a 500 mL water to obtain a slurry, this slurry was filtered to obtain a solid. A white solid of N-(p-aminosulfonylphenyl) methacrylamide was obtained by drying the solid after filtered (yield 46.9 g).

Next, N-(p-aminosulfonylphenyl) methacrylamide 4.61 g (0.0192 mol), ethyl methacrylate 2.94 g (0.0258 mol), acrylonitrile 0.80 g (0.015 mol) and N,N-dimethylacetamide 20 g were charged into a 20 mL three-spout flask provided with an agitator, cooling tube, and a dripping route and the mixture was agitated while it was heated at 65° C. with a hot bath. "V-65" (made by Wako Pure Chemical Industries, Ltd.) 0.15 g was added to this mixture and the mixture was agitated for two hours while it was placed under a nitrogen stream, keeping it at the temperature of 65° C. Furthermore, to this mixture, N-(p-aminosulfonylphenyl) methacrylamide 4.61 g, ethyl methacrylate 2.94 g, acrylonitrile 0.80 g and a mixture of N,N-dimethylacetamide and "V-65" 0.15 g were dripped with a dripping route for two hours. After completing the dripping, the mixture obtained was agitated at 65° C. for two hours. After completing the reaction, methanol 40 g was added to the mixture and was cooled, and the mixture obtained was charged into a 2 L water while the water was agitated. After agitating the mixture for 30 minutes, a deposit was taken out by filtration and was dried to obtain a 15 g white solid specific copolymer 1.

When the weight average molecular weight of the specific copolymer 1 obtained was measured with a gel permeation chromatography, it was 53,000 (polystyrene standard).

(ii) Image Recording Layer A-2

(a) Formation of Undercoat Layer

The same undercoat solution as that used for an image recording layer A-1 was applied to an aluminum support and a substrate was obtained by drying the layer at 80° C. for 15 seconds. The coated quantity of the layer after dried was 15 $mg/m^2$.

(b) Formation of Thermosensitive Layer

After the following undercoat solution was applied to the substrate obtained so as to allow the coated quantity to be 0.85 $g/m^2$, the plate was dried at 140° C. for 50 seconds with Perfect Oven PH200 manufactured by Tabai Espec Corp. set at 7 of Wind Control, and after a photosensitive layer coating solution was so applied as to allow the coated quantity to be 0.15 $g/m^2$, the plate was dried at 120° C. for one minute to obtain a presensitized plate.

<Composition of Undercoat Solution>

N-(4-aminosulfonylphenol) methacrylamide/acrylonitrile/methyl methacrylate (36/34/30: weight average molecular weight 50,000): 1.896 g Cresol novolak resin (m/p=6/4, weight average molecular weight 4,500, residual monomer 0.8 wt %): 0.237 g Cyanine dye A expressed by the aforementioned structural formula: 0.109 g 4,4'bishydroxyphenylsulfone: 0.063 g tetrahydrophthalic anhydride: 0.190 g p-toluenesulfonic acid: 0.008 g A compound formed by converting a counter ion of ethyl violet into 6-hydroxynahthalenesulfone: 0.05 g Fluorine-containing surfactant (MEGAFACE F176 made by Dainippon Ink And Chemicals, Incorporated): 0.035 g by Dainippon Ink And Chemicals, Incorporated): 0.035 g Methylethylketone: 26.6 g 1-methoxy-2-propanol: 13.6 g γ-butyrolactone: 13.8 g <Photosensitive Layer Coating Solution> m, p-cresol novolak resin (m/p ratio=6/4, weight average molecular weight 4,500, unreacted cresol 0.8 wt % contained): 0.237 g Cyanine dye A expressed by the aforementioned structural formula: 0.047 g dodecyl stearate: 0.060 g 3-methoxy-4-diazophenylamine hexafluorophosphate 0.030 g Fluorine-containing surfactant MEGAFACE F176 made by Dainippon Ink And chemicals, Incorporated): 0.110 g Fluorine-containing surfactant MEGAFACE MCF312 (30 wt %) made by Dainippon Ink And Chemicals, Incorporated): 0.120 g Methylethylketone: 15.1 g 1-methoxy-2-propanol:7.7 g (iii) Image Recording Layer A-3

(a) Formation of Undercoat Layer

The same undercoat solution as that used for an image recording layer A-1 was applied to an aluminum plate and a layer was dried at 80° C. for 15 seconds to obtain a substrate. The coated quantity of a layer after drying was 15 $mg/m^2$.

(b) Formation of Photosensitive Layer

The following photosensitive layer coating solution 1 was applied to the substrate obtained so as to allow the coated quantity to be 1.8 $g/m^2$ and the plate was dried to obtain a presensitized plate.

<Composition of Photosensitive Layer Coating Solution 1> m, p-cresol novolak resin (m/p ratio=6/4, weight average molecular weight 8,000, unreacted cresol 0.5 wt % contained): 1.0 g Cyanine dye A expressed by the aforementioned structural formula: 0.1 g tetrahydrophthalic anhydride: 0.05 g p-toluenesulfonic acid: 0.002 g A compound formed by converting a counter ion of ethyl violet into 6-hydroxy-β-naphthalenesulfonic acid: 0.02 g Fluorine-containing surfactant (MEGAFACE F-177 made by Dainippon Ink And Chemicals, Incorporated): 0.05 g Methylethylketone: 12 g (iv) Image Recording Layer B-1

(a) Formation of Undercoat Layer

The following undercoat solution was applied to an aluminum support and the support was dried at 80° C. for 30 seconds. The coated quantity after dried was 10 $mg/m^2$.

<Composition of Undercoat Solution>

β-alanine: 0.1 g

Phenylsulfonic acid: 0.05 g

Methanol: 40 g

Purified water: 60 g (b) Formation of Photosensitive Layer

The solution of the following composition was applied to an aluminum support and a negative-type presensitized plate was obtained by drying the support at 100° C. for one minute. The coated weight after dried was 1.3 $g/m^2$.

<Composition of Solution>

A compound expressed by the following formula I-b-33: 0.15 g

Infrared red absorber IR-Dye-4: 0.10 g (the following structural formula, made by Nihon Photosensitizing Dye Institute)

Novolak resin made from phenol and formaldehyde (weight average molecular weight 10,000): 1.5 g Cross-linking agent MM-1 (the following structural formula): 0.50 g Fluorine-containing surfactant (MEGAFACE F-177 made by Dainippon Ink And Chemicals, Incorporated): 0.03 g (I-b-33)

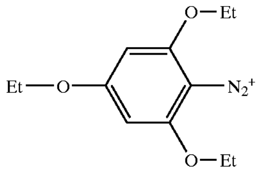

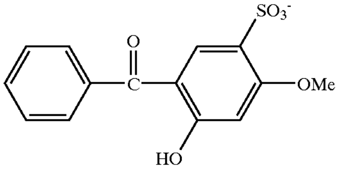

[MM-1]

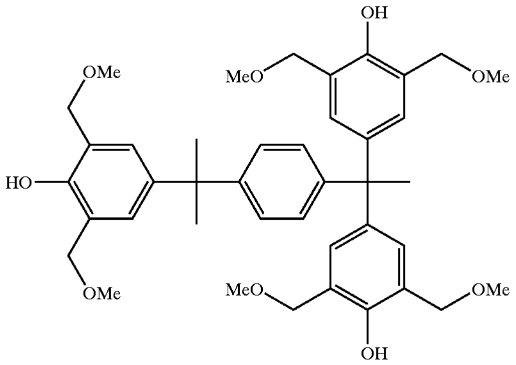

(IR-Dye-4)

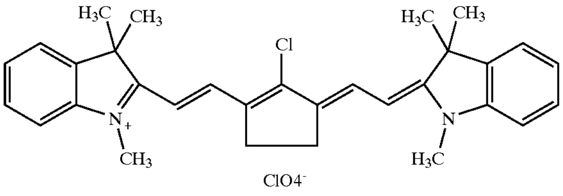

(v) Image Recording Layer B-2

(a) Formation of Undercoat Layer

The undercoat layer solution of the following composition was applied and the layer was dried in the atmosphere at 80° C. for 30 seconds. The coated quantity after dried was 10 $mg/m^2$.

<Composition of Undercoat Layer Solution>

2-aminoethylphosphonic acid: 0.2 g

Copolymer of mole rate 75:15 of ethylacrylate to 2-acrylamide-2-methyl-1-propane sodium sulfonate: 0.3 g Methanol: 40 g Ion-exchanged water: 60 g (b) Formation of Recording Layer The recording layer coating solution of the following composition was applied with a wire bar to an aluminum support on which the aforementioned undercoat layer was formed and a recording layer was formed by drying the support at 120° C. for 45 seconds with a hot-air drying equipment to obtain a presensitized plate. The coated quantity after dried was 1.4 $g/m^2$.

The structure of the infrared red absorber or the like used for preparation of the recording layer coating solution was as described below.

<Composition of Recording Layer Solution>

Behenic acid ((D) component): 0.02 g

N-allylstearamide ((D) component): 0.01 g

Infrared absorbent (IR-1) ((C) component): 0.08 g

Onium salts (KO-1) ((A) component): 0.05 g

Onium salts (KO-2) ((A) component): 0.15 g

Dipentaerythrytol hexaacrylate ((B) component): 0.80 g

Copolymer of mole rate 80:20 of acrylmethacrylate to methacrylic acid (weight average molecular weight 140,000) ((E) component): 1.20 g Naphthalenesulfonate of Victoria pure blue: 0.04 g p-methoxyphenol: 0.001 g Fluorine-containing surfactant (MEGAFACE KF309 made by Dainippon Ink And Chemicals, Incorporated): 0.03 g by Dainippon Ink And Chemicals, Incorporated): 0.03 g Methyethylketone: 10 g γ-butyrolactone: 5 g Methanol: 7 g 1-methoxy-3-propanol: 5 g (IR-1)

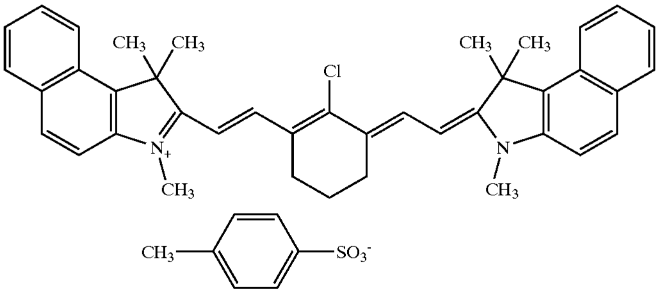

-continued (KO-1)

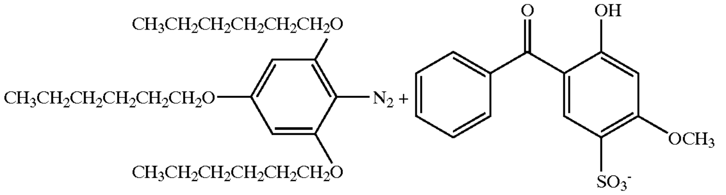

(KO-2)

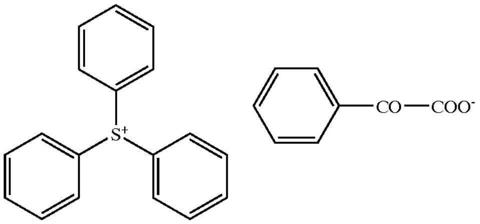

(vi) Image recording layer C-1

(a) Formation of Undercoat Layer

The following undercoat liquid composition was applied to an aluminum support so as to allow Si quantity to be 0.001 $g/m^2$ and the support was dried at 100° C. for one minute.

<Undercoat Liquid Composition>

About 5 minutes after the following components were agitated, heat was generated. After it was allowed to react for 60 minutes, the contents were transferred to another container, the compound in which 30,000 parts by weight of methanol was further added to obtain the undercoat liquid composition.

- Phosmer PE made by Uni-Chemical Co., Ltd.: 20 parts by weight
- Methanol: 130 parts by weight
- Water: 20 parts by weight
- p-toluenesulfonic acid: 5 parts by weight
- Tetraethoxysilane: 50 parts by weight
- 3-methacryloxypropyltriethoxysilane: 50 parts by weight (b) Formation of Photosensitive Layer A photopolymerizable composition of the following composition was applied to the aforementioned undercoat layer so as to allow the dried coat quantity to be 1.5 $g/m^2$ and the layer was dried at 100° C. for one minute to form a photosensitive layer.

Subsequently, a 3 wt % aqueous solution of polyvinylalcohol (saponification 98 mol %, degree of polymerization 500) was applied to this photosensitive layer so as to allow the dried coat weight to be 2.5 $g/m^2$, and the layer was dried at 120° C. for three minutes to obtain a photosensitive presensitized plate.

<Photosensitive Coating Solution (Photopolymerizable Composition)>

- Compound containing ethylenic-unsaturated bond (A-1): 1.7 parts by weight
- Linear organic polymer (B-1): 1.9 parts by weight
- Sensitizer (C-1): 0.15 parts by weight
- Photoinitiator (D-1): 0.30 parts by weight
- Additive (S-1): 0.50 parts by weight
- Fluorine-containing surfactant (MEGAFACE F-177 made by Dainippon Ink And Chemicals, Incorporated): 0.03 parts by weight
- Thermal polymerization inhibitor (N-nitrosohydroxylamine aluminum salts) 0.01 parts by weight
- ε type copper phthalocyanine dispersed substance: 0.2 parts by weight
- Methylethylketone: 30.0 parts by weight
- Propyleneglycol monomethyl ether: 30.0 parts by weight Shown below are a compound containing ethylenic-unsaturated bond (A), a linear organic polymer (B), a sensitizer (C), a photoinitiator (D) and an additive (S) used for the photosensitive coating solution.

(A-1)

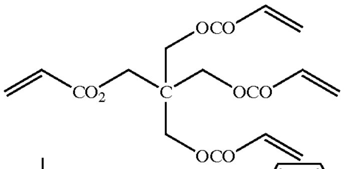

(A-2)

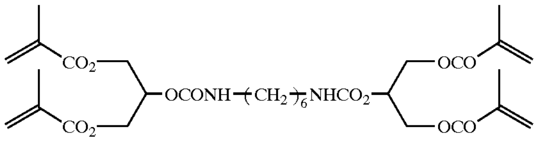

(A-3)

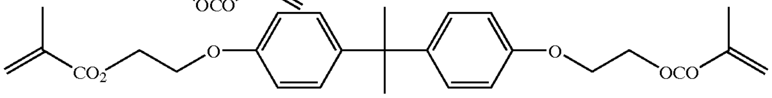

(50wt%)

MIXTURE (50wt%)

-continued
(A-4)
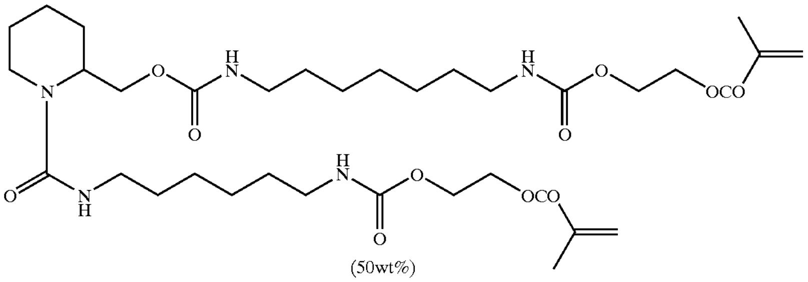
(50wt%)
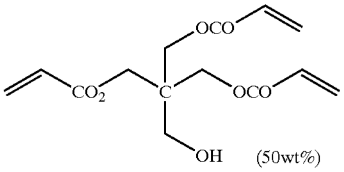
MIXTURE (50wt%)
(B-1)
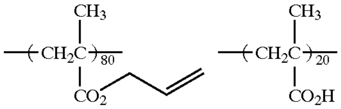
$\overline{M}w$50000
(B-2)
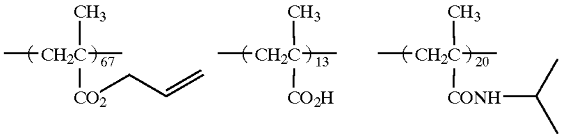
$\overline{M}w$50000
(B-3)
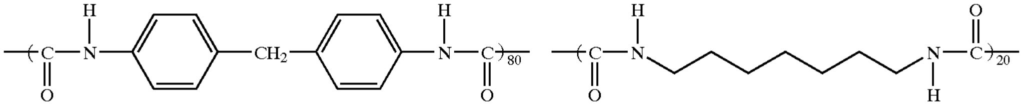
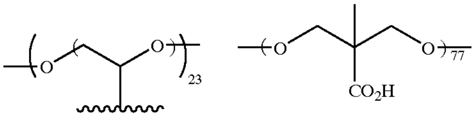
$\overline{M}w$60000
PPG10000
(C-1)
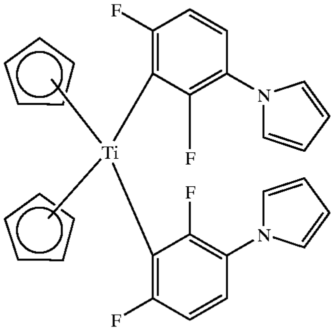
(C-2)
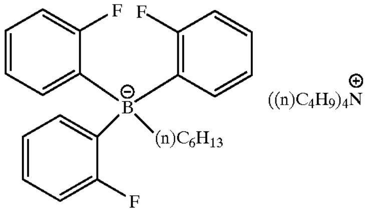
lp;.5p -continued (C-3)

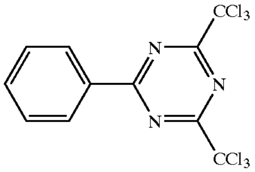

(C-4)

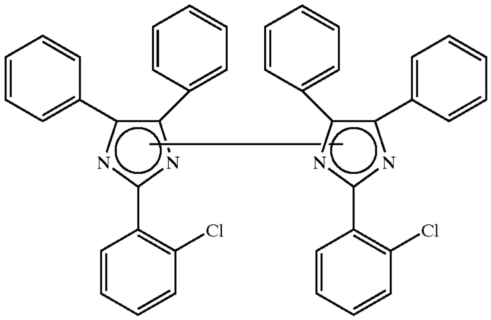

(D-1)

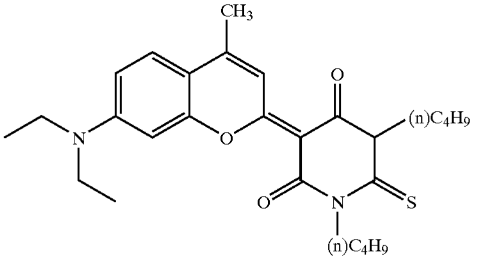

(D-2)

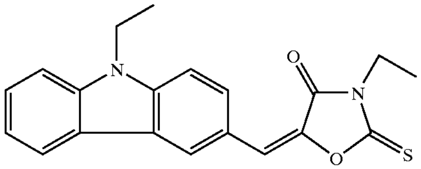

(D-3)

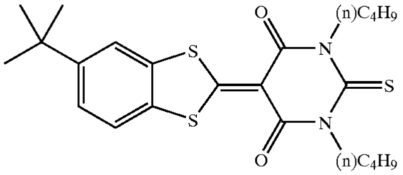

(D-4)

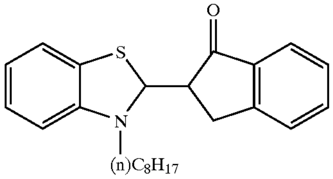

(S-1)

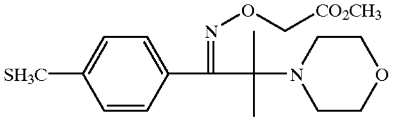

(S-2)

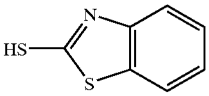

(S-3)

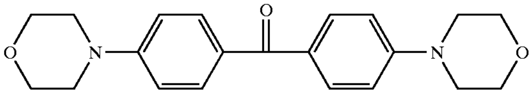

Meanwhile, the acid value of the photosensitive layer was an actually measured value calculated after acid quantity contained per 1 g of a photosensitive layer was measured with a sodium hydroxide titration, which was 0.45 meq/g.

(vii) Image Recording Layer C-2

A presensitized plate was obtained by performing the same processing as in an image recording layer C-1 except for that the mentioned components are replaced with those as described below.

<Photosensitive Layer Coating Solution (Photopolymerizable Composition)>

Linear organic polymer (B-2): 1.9 parts by weight

Photoinitiator (D-2): 0.30 parts by weight

The acid value of a photosensitive layer was 0.43 meq/g.

(viii) Image Recording Layer C-3

(a) Formation of Undercoat Layer

A highly-sensitive photopolymerizable composition 1 of the following composition was applied to an aluminum support so as to allow the dried coat weight to be 1.5 g/$m^2$ and the support was dried at 100° C. for one minute to form an undercoat layer.

<Composition of Photopolymerizable Composition 1>

Tetramethylolmethanetetraacrylate: 1.5 g

Linear organic polymer ($B_1$): 2.0 g

Sensitizer ($C_1$) ($\lambda_{max}$ THF479 nm, $\epsilon$=6.9×$10^4$): 0.15 g

Photoinitiator ($D_1$): 0.2 g

IRGACURE 907 ($E_1$) (made by Ciba-Geigy): 0.4 g $\epsilon$-phthalocyanine/($B_1$) dispersed substance: 0.2 g Fluorine-containing nonionic surfactant (MEGAFACE F177 made by Dainippon Ink And Chemicals, Incorporated): 0.03 g Methylethylketone: 9 g Propyleneglycol monomethyl ether acetate: 7.5 g Toluene: 11 g ($B_1$)

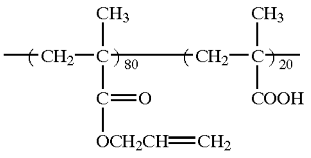

Mw = 40,000

-continued ($C_1$)

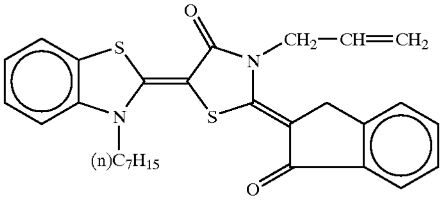

($D_1$)

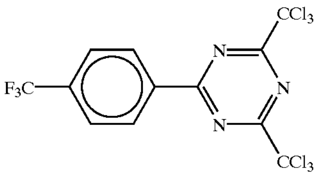

($E_1$)

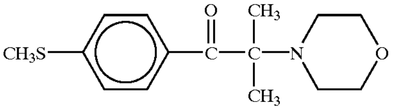

A 3 wt % aqueous solution of polyvinylalcohol (saponification 98 mol %, degree of polymerization 500) was applied on this photosensitive layer so as to allow the dried coat weight to be 2.5 g/$m^2$ and the layer was dried at 120° C. for 3 minutes to obtain a photopolymerizable presensitized plate.

(ix) Image Recording Layer D (a) Formation of Undercoat Layer

The undercoat solution of the following composition was applied to the surface of an aluminum plate and the support was dried at 80° C. for 30 seconds to obtain a substrate. The coated weight after dried was 30 mg/$m^2$.

<Composition of Undercoat Solution>

Aminoethylphosphonic acid: 0.10 g
Phenylphosphonic acid: 0.15 g
β-alanine: 0.10 g
Methanol: 40 g
Purified water: 60 g (b) Formation of Photosensitive Layer The next photosensitive solution was applied on the substrate thus manufactured and the substrate was dried at 110° C. for one minute to obtain a positive type photosensitive presensitized plate.

<Composition of Photosensitive Solution>

Esterified substance (as described in Example 1 of U.S. Pat. No. 3,635,709) of 1,2-diazonaphthoquinone-5-sulfonyichloride and pyrogallol-acetone resin): 0.45 g Cresolformaldehyde novolak resin (meta/para ratio=6/4, weight average molecular weight 3,000, number average molecular weight 1,100, unreacted cresol 0.7% contained): 1.1 g m-cresolformaldehvde novolak resin (weight average molecular weight 1,700, number average molecular weight 600, unreacted cresol 1% contained): 0.3g Poly (N-p-aminosulfonylphenyl)acrylamide-co n-butylacrylate-co-diethyleneglycol monomethyl ether methacrylate) (Mole ratio of each monomer in order: 40:40:20, weight average molecular weight 40,000, weight average molecular weight 20,000): 0.2 g p-normaloctylphenol-formaldehyde resin (as described in U.S. Pat. No. 4,123,279): 0.02 g Naphtoquinone-1,2-dyazide-4-sulfonate chloride: 0.01 g Tetrahydrophthalic anhydride: 0.1 g Benzoic acid: 0.02 g 4-(p-N,N-bis (ethoxycarbonylmethyl)aminophenyl)-2,6-bis (trichloromethyl)-S-triazne: 0.01 g 4-(p-N-(p-hydroxybenzoyl) aminophenyl)-2,6-bis (trichloromethyl)-S-triazine: 0.02 g 2-trichloromethyl-5-(4-hydroxystyryl)-1,3,4,-oxadiasol: 0.01 g Dye formed by converting a counter anion of Victoria pure blue BOH into 1-naphthalenesulfonic acid: 0.02 g Fluorine-containing surfactant (MODIPER F-200 made by NOF CORPORATION, a mixed solvent solution of 30 wt % methylethylketone and methylisobutylketone): 0.06 g Fluorine-containing surfactant (MEGAFACE F177 made by Dainippon Ink And Chemicals, Incorporated, 20 wt % methylisobutylketone solution): 0.02 g Methylethylketone: 15 g 1-methoxy-2-propanol: 10 g (x) Image Recording Layer E (a) Formation of Undercoat Layer The undercoat solution of the following composition was applied to the surface of an aluminum support and the support was dried at 100° C. for 10 seconds to obtain the substrate. The coated weight after dried was 10.0 mg/$m^2$.

<Composition of Undercoat Solution>

The following polymer compound: 0.3 g
Methanol: 100 g
Water: 1 g

| STRUCTURE No.1 | NUMBER-AVERAGE MOLECULAR WEIGHT (Mn) |
|---|---|
| 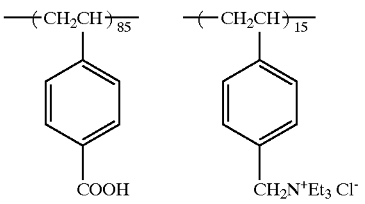 | 2,100 |

(b) Formation of Photosensitive Layer

Subsequently, a photosensitive layer was provided by applying a photosensitive solution A of the following composition on this substrate with a bar coater. The coat amount of the photosensitive layer after dried was 2.0 g/$m^2$. Moreover, in order to shorten a vacuum contact time at the time of exposure, a mat layer was formed by a method as described in JP 61-28986 B to obtain a photosensitive presensitized plate.

<Composition of Photosensitive Solution A>

Diazo resin-1 to be mentioned later: 1.2 g
Binder-1 to be mentioned later: 5.0 g
Oil soluble dye (Victoria pure blue-BOH): 0.15 g
Fluorine-containing surfactant (MEGAFACE F-177 made by Dainippon Ink And Chemicals, Incorporated): 0.02 g
tricresyl phosphate: 0.2 g
Phosphorous acid: 0.03 g
Malic acid: 0.03 g
Half ester of styrene/maleic anhydride copolymer per n-hexylalcohol: 0.05 g
Methyl 2-hydroxy-2-methylpropionate: 20.00 g
1-methoxy-2-propanol: 20.00 g
Methyl lactate: 7.00 g
Methanol: 25.00 g
Methylethylketone: 25.00 g
Water: 3.00 g Diazo resin-1 is hexafluorophosphate of a condensate of p-diazodiphenylamine with paraformaldehyde as described in "Synthesis example-1" of JP 59-78340 A. Binder-1 is a film forming polymer compound insoluble in water and soluble in an alkali aqueous solution of 2-hydroxyethylmethacrylate/acrylonitrile/methylmethacrylate/methacrylic acid methacrylic acid copolymer (weight ratio 50/20/26/4, average molecular weight 75,000, acid content 0.4 meq/g).

2. Exposure

Exposure was performed on each presensitized plate according to the following methods, and each presensitized plate was subjected to the development processing to be described later.

(1) Image Recording Layers A-1 to A-3

Exposure was performed under the conditions of rotational speed at 150 rpm and a plate surface power of 140 mJ with a plate setter (TrendSetter3444F) made by Creo Inc.

(2) Image Recording Layers B-1 and B-2

Exposure was performed under the conditions of rotational speed at 150 rpm and a plate surface power of 100 mJ with a plate setter (TrendSetter3444F) made by Creo Inc.

(3) Image Recording Layers C-1 and C-3

Scanning exposure was performed on a solid image and a dot image of 1 to 99% (in increments of 1%) with the conditions to allow an exposure condition (a standard exposure condition) to be 100 p/cm$^2$ and to be 175 lines/inch per 4,000 dpi using FD·YAG laser of wavelength 532 nm and power 100 mW (Plate Jet made by CSI). After exposed, preheating was performed under the condition that a plate surface temperature would reach 100° C.

(4) Image Recording Layer C-2

Scanning exposure was performed on a solid image and a dot image 1 to 99% (in increments of 1%) with the conditions to allow an exposure condition (a standard exposure condition) to be 100 $\mu$/cm$^2$ and to be 175 lines/inch per 4,000 dpi using VioletLD (Inner drum type experimental machine) of wavelength 405 nm and power 30 mW. After exposed, preheating was performed under the condition that a plate surface temperature would reach 100° C.

(5) Image Recording Layer D

Exposure was performed for 50 seconds with a 3 kW metal halide lamp from a distance of 1 m through a transparent positive film.

(6) Image Recording Layer E

Exposure was performed for 60 seconds with a 3 kW metal halide lamp from a distance of 1 m through a transparent negative film.

3. Development Processing

Either one of the following development processings 1 to 6 as shown in Table 1 was performed on each presensitized plate after exposed to obtain a lithographic printing plate, which was used for each evaluation to be described later.

(1) Development Processing 1 (Non-silicate Development for Positive Type)

Development processing was performed by an automatic developing machine 900NP with PS plate developer DT-1 made by Fuji Photo Film Co., Ltd., which substantially contains no alkali metal silicates and contains saccharides, under a normal working condition.

(2) Development Processing 2 (Silicate Development for Thermal Negative Type)

Development processing was performed by an automatic developing machine 900NP with PS plate developer DT-N made by Fuji Photo Film Co., Ltd., which substantially contains alkali metal silicates under a normal working condition. (3) Development processing 3 (Non-silicate development for photopolymer type)

Development processing was performed by an automatic developing machine 900NP with PS plate developer DV-2 made by Fuji Photo Film Co., Ltd., which substantially contains no alkali metal silicates and contains saccharides, under a normal working condition.

(4) Development Processing 4 (Silicate Development for Photopolymer Type)

Development processing was performed by an automatic developing machine 900NP with PS plate developer DV-1 made by Fuji Photo Film Co., Ltd., which substantially contains alkali metal silicates, under a normal working condition.

(5) Development Processing 5 (Silicate Treatment for Positive Type)

Development processing was performed by an automatic developing machine 900NP with PS plate developer DP-4 made by Fuji Photo Film Co., Ltd., which substantially contains alkali metal silicates, under a normal working condition.

(6) Development Processing 6 (Non-silicate Development for Negative Type)

Development processing was performed by an automatic developing machine 900NP with PS plate developer DN-3C made by Fuji Photo Film Co., Ltd., which substantially contains no alkali metal silicates and contains ethanolamines, under a normal working condition.

4. Evaluation of Presensitized Plate

Resistance to aggressive ink staining, scum resistance and resistance to plate fracture when prepared as a lithographic printing plate were evaluated with the following methods.

(1) Resistance to Aggressive Ink Staining

Printing was performed with a fountain water to which Cl ion was added, and the stain of non-image area when the lithographic printing plate was left as it stands once or more was visually inspected for evaluation.

The results are shown in Table 1. The results were graded as ⊚, ○, ○Δ, Δ, ΔX and X in the order of increasing stain thereof.

(2) Scum Resistance

Printing was performed on the lithographic printing plate obtained as above, with DIC-GEOS(s) magenta ink by Mitsubishi Diamond Type F2 printing machine (made by Mitsubishi Heavy industries, Ltd.), and the scum of a blanket after printing of 10,000 sheets had been performed was once transferred into a scotch tape, which was affixed to a white paper, and the amount of ink transferred on the tape was visually inspected for evaluation.

The results are shown in Table 1. The results were graded as ⊚, ○, ○Δ, Δ, ΔX and X in the order of increasing the stain thereof.

(3) Resistance to Plate Fracture

Burning-in processing was performed on a lithographic printing plate at 240° C. for 7 minutes with a burning processor made by Fuji Photo Film Co., Ltd. and plate fracture both at the time of mounting a plate and during printing were evaluated.

1) Plate fracture at the time of mounting a plate

For mounting a lithographic printing plate on a plate cylinder, after an upper and lower ends thereof are bent by a device called a bender, one end is hung on a section called "a gripper" of the plate cylinder and the other is hung on the section called "a gripper edge", and the plate is then attached to the plate cylinder and fixed thereto while applying a moderate tension on the plate against the plate cylinder by winding the gripper edge. If a winding force is excessive, a plate may sometimes fracture as it may not endure the tension.

As for resistance to plate fracture at mounting, 10 lithographic printing plates after burning-in processing was performed were mounted on a plate cylinders, and the resistance to plate fracture was evaluated by the number of plates which fractured.

The results are shown in Table 1. The number of broken pieces is indicated as follows: zero by ⊚, 1 by ○,2 by ○Δ, 3 by Δ, 4 by ΔX, and 5 or more by X.

2) Plate Fracture During Printing

Printing with one million sheets with n=10 was performed with each lithographic printing plate which burning-in processing was applied thereto. Resistance to plate fracture during printing was evaluated with the number of lithographic plates on which either a gripper or a gripper edge was broken before the number of printing reached one million sheets.

The results are shown in Table 1. The number of broken pieces is indicated as follows: zero by ⊚, 1 by ○, 2 by ○Δ, 3 by Δ, 4 by ΔX, and 5 or more by X.

As apparent from Table 1, a presensitized plate according to the present invention obtained from a support for a lithographic printing plate according to the present invention was excellent in resistance to aggressive ink staining, as well as scum resistance since a defect did not easily occur on an anodized layer when the plate was made into the lithographic printing plate. Further, it was excellent in resistance to plate fracture since it had a high strength when a lithographic plate was manufactured (Examples 1—1 to 1–98).

On the contrary, when specified trace elements were not contained in a plate (comparative examples 1—1 to 1–3), resistance to aggressive ink staining and scum resistance were not sufficient. Moreover, when neither Mn nor Mg was contained (comparative examples 1–4), plate fracture easily occurred since a strength was inferior.

TABLE 1

| | Presensitized plate | | | | | Resistance to plate fracture of lithographic printing plate | | Printing characteristics of lithographic printing plate | |
|---|---|---|---|---|---|---|---|---|---|
| | Al plate | Graining treatment | Interface treatment | Image recording layer | Developing process | Plate fracture at mounting | Plate fracture during printing | Scum resistance | Resistance to aggressive ink staining |
| Example 1-1 | 1 | 2 | Silicate + Undercoating | A-1 | 1 | ⊚ | ⊚ | ○ | ⊚ |
| Example 1-2 | 2 | 2 | Silicate + Undercoating | A-1 | 1 | ⊚ | ⊚ | ○ | ⊚ |
| Example 1-3 | 3 | 2 | Silicate + Undercoating | A-1 | 1 | ⊚ | ⊚ | ○ | ⊚ |
| Example 1-4 | 4 | 2 | Silicate + Undercoating | A-1 | 1 | ⊚ | ⊚ | ○ | ⊚ |
| Example 1-5 | 5 | 2 | Silicate + Undercoating | A-1 | 1 | ⊚ | ⊚ | ○ | ⊚ |
| Example 1-6 | 6 | 2 | Silicate + Undercoating | A-1 | 1 | ⊚ | ⊚ | ○ | ⊚ |
| Example 1-7 | 7 | 2 | Silicate + Undercoating | A-1 | 1 | ⊚ | ⊚ | ○ | ⊚ |
| Example 1-8 | 8 | 2 | Silicate + Undercoating | A-1 | 1 | ⊚ | ⊚ | ○ | ⊚ |
| Example 1-9 | 9 | 2 | Silicate + Undercoating | A-1 | 1 | ⊚ | ⊚ | ○ | ⊚ |
| Example 1-10 | 10 | 2 | Silicate + Undercoating | A-1 | 1 | ⊚ | ⊚ | ○ | ⊚ |
| Example 1-11 | 11 | 2 | Silicate + Undercoating | A-1 | 1 | ⊚ | ⊚ | ○ | ⊚ |
| Example 1-12 | 12 | 2 | Silicate + Undercoating | A-1 | 1 | ⊚ | ⊚ | ○ | ⊚ |
| Example 1-13 | 13 | 2 | Silicate + Undercoating | A-1 | 1 | ⊚ | ⊚ | ○ | ⊚ |
| Example 1-14 | 14 | 2 | Silicate + Undercoating | A-1 | 1 | ⊚ | ⊚ | ○ | ⊚ |
| Example 1-15 | 15 | 2 | Silicate + Undercoating | A-1 | 1 | ⊚ | ⊚ | ○ | ⊚ |
| Example 1-16 | 16 | 2 | Silicate + Undercoating | A-1 | 1 | ⊚ | ⊚ | ○ | ⊚ |
| Example 1-17 | 17 | 2 | Silicate + Undercoating | A-1 | 1 | ⊚ | ⊚ | ○ | ⊚ |
| Example 1-18 | 18 | 2 | Silicate + Undercoating | A-1 | 1 | ⊚ | ⊚ | ○ | ⊚ |
| Example 1-19 | 19 | 2 | Silicate + Undercoating | A-1 | 1 | ⊚ | ⊚ | ○ | ⊚ |
| Example 1-20 | 20 | 2 | Silicate + Undercoating | A-1 | 1 | ⊚ | ⊚ | ○ | ⊚ |
| Example 1-21 | 21 | 2 | Silicate + Undercoating | A-1 | 1 | ⊚ | ⊚ | ○ | ⊚ |
| Example 1-22 | 22 | 2 | Silicate + Undercoating | A-1 | 1 | ⊚ | ⊚ | ○ | ⊚ |
| Example 1-23 | 23 | 2 | Silicate + Undercoating | A-1 | 1 | ⊚ | ⊚ | ○ | ⊚ |
| Example 1-24 | 24 | 2 | Silicate + Undercoating | A-1 | 1 | ⊚ | ⊚ | ○ | ⊚ |
| Example 1-25 | 25 | 2 | Silicate + Undercoating | A-1 | 1 | ⊚ | ⊚ | ○ | ⊚ |
| Example 1-26 | 26 | 2 | Silicate + Undercoating | A-1 | 1 | ⊚ | ⊚ | ○ | ⊚ |
| Example 1-27 | 27 | 2 | Silicate + Undercoating | A-1 | 1 | ⊚ | ⊚ | ○ | ⊚ |
| Example 1-28 | 28 | 2 | Silicate + Undercoating | A-1 | 1 | ⊚ | ⊚ | ○ | ⊚ |
| Example 1-29 | 29 | 2 | Silicate + Undercoating | A-1 | 1 | ⊚ | ⊚ | ○ | ⊚ |
| Example 1-30 | 30 | 2 | Silicate + Undercoating | A-1 | 1 | ⊚ | ⊚ | ○ | ⊚ |
| Example 1-31 | 31 | 2 | Silicate + Undercoating | A-1 | 1 | ⊚ | ⊚ | ○ | ⊚ |
| Example 1-32 | 32 | 2 | Silicate + Undercoating | A-1 | 1 | ⊚ | ⊚ | ○ | ⊚ |
| Example 1-33 | 33 | 2 | Silicate + Undercoating | A-1 | 1 | ⊚ | ⊚ | ○ | ⊚ |
| Example 1-34 | 34 | 2 | Silicate + Undercoating | A-1 | 1 | ⊚ | ⊚ | ○ | ⊚ |
| Example 1-35 | 35 | 2 | Silicate + Undercoating | A-1 | 1 | ⊚ | ⊚ | ○ | ⊚ |
| Example 1-36 | 36 | 2 | Silicate + Undercoating | A-1 | 1 | ⊚ | ⊚ | ○ | ⊚ |
| Example 1-37 | 37 | 2 | Silicate + Undercoating | A-1 | 1 | ⊚ | ⊚ | ○ | ⊚ |
| Example 1-38 | 38 | 2 | Silicate + Undercoating | A-1 | 1 | ⊚ | ⊚ | ○ | ⊚ |
| Example 1-39 | 39 | 2 | Silicate + Undercoating | A-1 | 1 | ⊚ | ⊚ | ○ | ⊚ |
| Example 1-40 | 40 | 2 | Silicate + Undercoating | A-1 | 1 | ⊚ | ⊚ | ○ | ⊚ |
| Example 1-41 | 41 | 2 | Silicate + Undercoating | A-1 | 1 | ⊚ | ⊚ | ○ | ⊚ |
| Example 1-42 | 42 | 2 | Silicate + Undercoating | A-1 | 1 | ⊚ | ⊚ | ○ | ⊚ |
| Example 1-43 | 43 | 2 | Silicate + Undercoating | A-1 | 1 | ⊚ | ⊚ | ○ | ⊚ |
| Example 1-44 | 44 | 2 | Silicate + Undercoating | A-1 | 1 | ⊚ | ⊚ | ○ | ⊚ |
| Example 1-45 | 45 | 2 | Silicate + Undercoating | A-1 | 1 | ⊚ | ⊚ | ○ | ⊚ |

TABLE 1-continued

| | Presensitized plate | | | | | Resistance to plate fracture of lithographic printing plate | | Printing characteristics of lithographic printing plate | |
|---|---|---|---|---|---|---|---|---|---|
| | Al plate | Graining treatment | Interface treatment | Image recording layer | Developing process | Plate fracture at mounting | Plate fracture during printing | Scum resistance | Resistance to aggressive ink staining |
| Example 1-46 | 46 | 2 | Silicate + Undercoating | A-1 | 1 | ◎ | ◎ | ○ | ◎ |
| Example 1-47 | 47 | 2 | Silicate + Undercoating | A-1 | 1 | ◎ | ◎ | ○ | ◎ |
| Example 1-48 | 48 | 2 | Silicate + Undercoating | A-1 | 1 | ○ | ◎ | ○ | ◎ |
| Example 1-49 | 49 | 2 | Silicate + Undercoating | A-1 | 1 | ○ | ◎ | ○ | ◎ |
| Example 1-50 | 50 | 2 | Silicate + Undercoating | A-1 | 1 | ○ | ◎ | ○ | ◎ |
| Example 1-51 | 51 | 2 | Silicate + Undercoating | A-1 | 1 | ○ | ◎ | ○ | ◎ |
| Example 1-52 | 52 | 2 | Silicate + Undercoating | A-1 | 1 | ○ | ◎ | ○ | ◎ |
| Example 1-53 | 53 | 2 | Silicate + Undercoating | A-1 | 1 | ○ | ◎ | ○ | ◎ |
| Example 1-54 | 54 | 2 | Silicate + Undercoating | A-1 | 1 | ○ | ◎ | ○ | ◎ |
| Example 1-55 | 55 | 2 | Silicate + Undercoating | A-1 | 1 | ○ | ◎ | ○ | ◎ |
| Example 1-56 | 56 | 2 | Silicate + Undercoating | A-1 | 1 | ○ | ◎ | ○ | ◎ |
| Example 1-57 | 57 | 2 | Silicate + Undercoating | A-1 | 1 | ○ | ◎ | ○ | ◎ |
| Example 1-58 | 58 | 2 | Silicate + Undercoating | A-1 | 1 | ○ | ◎ | ○ | ◎ |
| Example 1-59 | 59 | 2 | Silicate + Undercoating | A-1 | 1 | ○ | ◎ | ○ | ◎ |
| Example 1-60 | 60 | 2 | Silicate + Undercoating | A-1 | 1 | ○ | ◎ | ○ | ◎ |
| Example 1-61 | 61 | 2 | Silicate + Undercoating | A-1 | 1 | ○ | ◎ | ○ | ◎ |
| Example 1-62 | 62 | 2 | Silicate + Undercoating | A-1 | 1 | ○ | ◎ | ○ | ◎ |
| Example 1-63 | 63 | 2 | Silicate + Undercoating | A-1 | 1 | ○ | ◎ | ○ | ◎ |
| Example 1-64 | 64 | 2 | Silicate + Undercoating | A-1 | 1 | ○ | ◎ | ○ | ◎ |
| Example 1-65 | 65 | 2 | Silicate + Undercoating | A-1 | 1 | ○ | ◎ | ○ | ◎ |
| Example 1-66 | 66 | 2 | Silicate + Undercoating | A-1 | 1 | ○ | ◎ | ○ | ◎ |
| Example 1-67 | 67 | 2 | Silicate + Undercoating | A-1 | 1 | ○ | ◎ | ○ | ◎ |
| Example 1-68 | 68 | 2 | Silicate + Undercoating | A-1 | 1 | ○ | ◎ | ○ | ◎ |
| Example 1-69 | 69 | 2 | Silicate + Undercoating | A-1 | 1 | ○ | ◎ | ○ | ◎ |
| Example 1-70 | 70 | 2 | Silicate + Undercoating | A-1 | 1 | ○ | ◎ | ○ | ◎ |
| Example 1-71 | 71 | 2 | Silicate + Undercoating | A-1 | 1 | ○ | ◎ | ○ | ◎ |
| Example 1-72 | 72 | 2 | Silicate + Undercoating | A-1 | 1 | ○ | ◎ | ○ | ◎ |
| Example 1-73 | 73 | 2 | Silicate + Undercoating | A-1 | 1 | ○ | ◎ | ○ | ◎ |
| Example 1-74 | 1 | 1 | Silicate + Undercoating | A-1 | 1 | ◎ | ◎ | ○ | ◎ |
| Example 1-75 | 1 | 3 | Silicate + Undercoating | A-1 | 1 | ◎ | ◎ | ○ | ◎ |
| Example 1-76 | 1 | 2 | Silicate + Undercoating | A-2 | 1 | ◎ | ◎ | ○ | ◎ |
| Example 1-77 | 1 | 2 | Undercoating | A-3 | 5 | ◎ | ◎ | ○ | ◎ |
| Example 1-78 | 1 | 2 | Undercoating | B-2 | 2 | ◎ | ◎ | ○ | ◎ |
| Example 1-79 | 1 | 2 | Undercoating | C-2 | 3 | ◎ | ◎ | ○ | ◎ |
| Example 1-80 | 8 | 2 | Undercoating | B-1 | 2 | ○ | ◎ | ○ | ○ |
| Example 1-81 | 8 | 2 | Silicate + Undercoating | C-1 | 3 | ○ | ◎ | ○ | ◎ |
| Example 1-82 | 8 | 2 | Undercoating | C-3 | 4 | ○ | ◎ | ○ | ○ |
| Example 1-83 | 8 | 2 | Silicate + Undercoating | D | 1 | ○ | ◎ | ○ | ◎ |
| Example 1-84 | 8 | 2 | Undercoating | D | 5 | ○ | ◎ | ○ | ○ |
| Example 1-85 | 8 | 2 | Silicate + Undercoating | E | 6 | ○ | ◎ | ○ | ◎ |
| Example 1-86 | 17 | 2 | Undercoating | B-1 | 2 | ◎ | ◎ | ○ | ○ |
| Example 1-87 | 17 | 2 | Silicate + Undercoating | C-1 | 3 | ◎ | ◎ | ○ | ◎ |
| Example 1-88 | 17 | 2 | Undercoating | C-3 | 4 | ◎ | ◎ | ○ | ○ |
| Example 1-89 | 17 | 2 | Silicate + Undercoating | D | 1 | ◎ | ◎ | ○ | ◎ |
| Example 1-90 | 17 | 2 | Undercoating | D | 5 | ◎ | ◎ | ○ | ○ |
| Example 1-91 | 17 | 2 | Silicate + Undercoating | E | 6 | ◎ | ◎ | ○ | ◎ |
| Example 1-92 | 41 | 2 | Undercoating | B-1 | 2 | ◎ | ◎ | ○ | ○ |
| Example 1-93 | 41 | 2 | Silicate + Undercoating | C-1 | 3 | ◎ | ◎ | ○ | ◎ |
| Example 1-94 | 41 | 2 | Undercoating | C-3 | 4 | ◎ | ◎ | ○ | ○ |
| Example 1-95 | 41 | 2 | Silicate + Undercoating | D | 1 | ◎ | ◎ | ○ | ◎ |
| Example 1-96 | 41 | 2 | Undercoating | D | 5 | ◎ | ◎ | ○ | ○ |
| Example 1-97 | 41 | 2 | Silicate + Undercoating | E | 6 | ◎ | ◎ | ○ | ◎ |
| Example 1-98 | 78 | 2 | Silicate + Undercoating | A-1 | 1 | ◎ | ◎ | ○ | ◎ |
| Comparative Example 1-1 | 74 | 2 | Silicate + Undercoating | A-1 | 1 | ◎ | ◎ | ΔX | ○Δ |
| Comparative Example 1-2 | 75 | 2 | Silicate + Undercoating | A-1 | 1 | ○ | ◎ | ΔX | ○Δ |
| Comparative Example 1-3 | 76 | 2 | Silicate + Undercoating | A-1 | 1 | ○ | ◎ | ΔX | ○Δ |
| Comparative Example 1-4 | 77 | 2 | Silicate + Undercoating | A-1 | 1 | X | X | ΔX | ○Δ |

TABLE 2

| Al plate | Base Al alloy | Specified trace element Element | Added amount (ppm) |
|---|---|---|---|
| 1 | 3 | Li | 2 |
| 2 | 3 | Be | 2 |
| 3 | 3 | Sc | 2 |
| 4 | 3 | Mo | 2 |
| 5 | 3 | Ag | 2 |
| 6 | 3 | Ge | 2 |
| 7 | 3 | Ce | 2 |
| 8 | 3 | Nd | 2 |
| 9 | 3 | Dy | 2 |
| 10 | 3 | Au | 2 |
| 11 | 3 | K | 1 |
| 12 | 3 | Rb | 1 |
| 13 | 3 | Cs | 1 |
| 14 | 3 | Sr | 1 |
| 15 | 3 | Y | 1 |
| 16 | 3 | Hf | 1 |
| 17 | 3 | W | 1 |
| 18 | 3 | Nb | 1 |
| 19 | 3 | Ta | 1 |
| 20 | 3 | Tc | 1 |
| 21 | 3 | Re | 1 |
| 22 | 3 | Ru | 1 |
| 23 | 3 | Os | 1 |
| 24 | 3 | Rh | 1 |
| 25 | 3 | Ir | 1 |
| 26 | 3 | Pd | 1 |
| 27 | 3 | Pt | 1 |
| 28 | 3 | In | 1 |
| 29 | 3 | Tl | 1 |
| 30 | 3 | As | 1 |
| 31 | 3 | Se | 1 |
| 32 | 3 | Te | 1 |
| 33 | 3 | Po | 1 |
| 34 | 3 | Pr | 1 |
| 35 | 3 | Sm | 1 |
| 36 | 3 | Tb | 1 |
| 37 | 3 | Ba | 12 |
| 38 | 3 | Co | 12 |
| 39 | 3 | Cd | 12 |
| 40 | 3 | Bi | 12 |
| 41 | 3 | La | 12 |
| 42 | 3 | Na | 55 |
| 43 | 3 | Ca | 55 |
| 44 | 3 | Zr | 55 |
| 45 | 3 | Cr | 55 |
| 46 | 3 | P | 55 |
| 47 | 3 | S | 55 |
| 48 | 1 | Ce | 2 |
| 49 | 1 | Nd | 2 |
| 50 | 1 | Dy | 2 |
| 51 | 1 | Hf | 1 |
| 52 | 1 | In | 1 |
| 53 | 1 | Tl | 1 |
| 54 | 1 | Pr | 1 |
| 55 | 1 | Sm | 1 |
| 56 | 1 | Tb | 1 |
| 57 | 1 | Co | 12 |
| 58 | 1 | Cd | 12 |
| 59 | 1 | Bi | 12 |
| 60 | 1 | La | 12 |
| 61 | 2 | Ce | 2 |
| 62 | 2 | Nd | 2 |
| 63 | 2 | Dy | 2 |
| 64 | 2 | Hf | 1 |
| 65 | 2 | In | 1 |
| 66 | 2 | Tl | 1 |
| 67 | 2 | Pr | 1 |
| 68 | 2 | Sm | 1 |
| 69 | 2 | Tb | 1 |
| 70 | 2 | Co | 12 |
| 71 | 2 | Cd | 12 |
| 72 | 2 | Bi | 12 |
| 73 | 2 | La | 12 |
| 74 | 3 | None | — |
| 75 | 2 | None | — |

TABLE 2-continued

| Al plate | Base Al alloy | Specified trace element Element | Added amount (ppm) |
|---|---|---|---|
| 76 | 1 | None | — |
| 77 | 4 | None | — |
| 78 | 3 | V | 55 |

TABLE 3

| Base Al alloy | Mn (wt %) | Mg (wt %) | Fe (wt %) | Si (wt %) | Cu (wt %) | Ti (wt %) |
|---|---|---|---|---|---|---|
| 1 | 0.200 | 0.000 | 0.30 | 0.1 | 0.005 | 0.02 |
| 2 | 0.000 | 0.200 | 0.30 | 0.1 | 0.005 | 0.02 |
| 3 | 1.100 | 1.100 | 0.30 | 0.1 | 0.005 | 0.02 |
| 4 | 0.000 | 0.000 | 0.30 | 0.1 | 0.005 | 0.02 |

<Example of the Second Aspect According to the Present Invention>

Examples 2-1 to 2–98 and Comparative Examples 2-1 to 2–4)

1. Manufacture of Presensitized Plate

As shown in Table 6, the aforementioned graining treatment 2 was performed on each aluminum plate AL1 to AL7 composed of the compositions shown in Table 4, and anodizing treatment and the following interface treatment were further performed in the same manner as in the first aspect according to the present invention to obtain each support for a lithographic printing plate.

Subsequently, each image recording layer was formed on each support for a lithographic printing in the same manner as in the first aspect according to the invention as shown in Table 6 to obtain each presensitized plate.

2. Exposure

Exposure was performed on each presensitized plate in the same manner as in the first aspect according to the present invention, and it was subjected to the development processing to be described later.

3. Development Processing

One of the aforementioned development processings 1 to 6 was performed on each presensitized plate after exposed as shown in Table 6 to obtain a lithographic printing plate, which was used for each evaluation to be described later.

4. Evaluation of Presensitized Plate

The density of intermetallic compounds of a support for a lithographic printing plate used for a presensitized plate, Al raw material cost, Al manufacturing cost, Al plate cost (calculated from Al raw material cost and Al manufacturing cost) and external appearance as well as press life and scum resistance when a lithographic printing plate was processed from a presensitized plate were evaluated with the following methods.

(1) Density of Intermetallic Compound

The density of intermetallic compounds was measured in the method that the surface of a support for a lithographic printing plate was surface analyzed in a range of 170 $\mu m \times 170$ $\mu m$, the number of intermetallic compounds was counted and the number converted into the number per 1 $mm^2$.

The results are shown in Table 5.

(2) Al Raw Material Cost

An Al raw material cost was expressed in a relative value with respect to the cost of an AL6 without the addition of scrap material which was assumed to be 100.

The results are shown in Table 5.

(3) Al Manufacturing Cost

Al manufacturing cost was expressed by a relative value with respect to the manufacturing cost when Al of JIS 1050 material was used which was assumed to be 100.

The results are shown in Table 5. When either one of Al1, Al2 or Al7 was used as an Al plate, it was understood that Al processing cost was slightly increased. This was because a power cost required for rolling becomes large since the hardness of an Al plate increases.

(4) Al Plate Cost

An Al plate cost was calculated as below from an Al raw material cost and an Al manufacturing cost. First, the relative value of the material cost of an Al plate used for each presensitized plate was calculated with respect to the material cost when a new metal of purity 99.7% or higher was used 100%, which was assumed to be 140. Next, the relative value of the manufacturing cost of an Al plate used for each presensitized plate was calculated with respect to the manufacturing cost of JIS 1050 material, which was assumed to be 130. Finally, the relative value of an Al material cost and the relative value of an Al manufacturing cost were summed up, and were multiplied by 100/270 to find an Al plate cost. This method was taken since an Al material cost fluctuates in response to the market price of a new metal of the purity 99.7% or higher.

The results are shown in Table 6.

(5) Appearance

The appearance of the surface of a support was visually evaluated.

The results are shown in Table 6. Evaluated in 10 levels from the most excellent level in appearance were A (◎), B (○), C, D (○Δ), E, F (Δ), G, H, I, J. The level D (○Δ) and higher are levels that have no problem in practice. In addition, there were some levels which are not shown in Table 6.

(6) Press Life

Printing was performed using DIC-GEOS(N) black ink made by Dainippon Ink And Chemicals, Incorporated by Lithrone Printing Machine made by Komori Corporation, and press life was evaluated by the number of printings at a time when a visual inspection recognizes what the concentration of a solid image begins to lower.

The results thereof are shown in Table 6. In Table 6, the result were expressed in the relative values with respect to the number of printings of Comparative Example 2-1, which was assumed to be 100.

(7) Scum Resistance

Printing was performed using DIC-GEOS(s) scarlet ink by Mitsubishi Diamond Type F2 printing machine (made by Mitsubishi Heavy industries, Ltd.), and the scum of a blanket after printing of 10,000 sheets was performed was once transferred into a scotch tape, which was affixed to a white paper and the amount of ink transcribed on the scotch tape was visually inspected for evaluation.

The results are shown in Table 6. Defined were almost no dirt was A, somewhat dirty was E, significantly dirty was I and they were evaluated in 9 levels including the middle levels. (A(○), B, C (○Δ), D, E, F, G (ΔX), H and I). Moreover, there were some levels that are not shown in Table 6.

TABLE 4

| No. | Fe | Si | Cu | Ti | Mn | Mg | Zn | Cr | Addition rate of scrap material |
|---|---|---|---|---|---|---|---|---|---|
| | Al alloy composition (wt %) | | | | | | | | |
| AL1 | 0.50 | 0.25 | 0.200 | 0.03 | 1.200 | 0.900 | 0.150 | 0.020 | 100 |
| AL2 | 0.75 | 0.5 | 0.450 | 0.05 | 1.500 | 1.300 | 0.300 | 0.060 | 100 |
| AL3 | 0.38 | 0.25 | 0.070 | 0.02 | 0.400 | 0.450 | 0.130 | 0.003 | 50 |
| AL4 | 0.30 | 0.13 | 0.050 | 0.02 | 0.009 | 0.009 | 0.010 | 0.002 | 5 |
| AL5 | 0.23 | 0.13 | 0.050 | 0.02 | 0.009 | 0.009 | 0.010 | 0.002 | 5 |
| AL6 | 0.30 | 0.08 | 0.015 | 0.03 | 0.000 | 0.000 | 0.002 | 0.002 | 0 |
| AL7 | 1.0 | 1.2 | 0.5 | 0.05 | 1.5 | 1.5 | 0.3 | 0.06 | 100 |

TABLE 5

Characteristics of each Al plate

| Al plate | Density of intermetallic compounds (pcs/mm²) | Al raw material cost | Al manufacturing cost | Kind of intermetallic compounds A | B | C |
|---|---|---|---|---|---|---|
| AL1 | 29000 | 75 | 102 | ○ | ○ | ○ |
| AL2 | 30000 | 75 | 102 | ○ | ○ | ○ |
| AL3 | 19000 | 87 | 100 | ○ | ○ | ○ |
| AL4 | 5500 | 97 | 100 | ○ | ○ | ○ |
| AL5 | 4000 | 97 | 100 | ○ | ○ | ○ |
| AL6 | 2800 | 100 | 100 | X | X | ○ |
| AL7 | 38000 | 75 | 105 | ○ | ○ | ○ |

A: Consisting of one or more kinds of intermetallic compounds consisting of three kinds or more of elements.
B: Consisting of one or more kinds of intermetallic compounds consisting of four kinds or more of elements.
C: Consisting of one or more kinds of intermetallic compounds consisting of two kinds or more of elements.

TABLE 6

| | Conditions: Al plate | Graining treatment | Anodizing treatment | Interface treatment | Image recording layer | Developing process | Al plate cost | Appearance of support | Printing characteristics of lithographic printing plate: Press life | Scum resistance |
|---|---|---|---|---|---|---|---|---|---|---|
| Example 2-1 | AL1 | 2 | Sulfuric acid anodizing | Silicate + Undercoating | A-1 | 1 | 88 | ◎ | 140 | ○ |
| Example 2-2 | AL2 | 2 | Sulfuric acid anodizing | Silicate + Undercoating | A-1 | 1 | 88 | ◎ | 160 | ○ |
| Example 2-3 | AL3 | 2 | Sulfuric acid anodizing | Silicate + Undercoating | A-1 | 1 | 93 | ○ | 120 | ○ |
| Example 2-4 | AL4 | 2 | Sulfuric acid anodizing | Silicate + Undercoating | A-1 | 1 | 98 | ○Δ | 110 | ○ |
| Example 2-5 | AL5 | 2 | Sulfuric acid anodizing | Silicate + Undercoating | A-1 | 1 | 98 | ○Δ | 100 | ○ |

TABLE 6-continued

| | Conditions | | | | | | | | Printing characteristics of lithographic printing plate | |
|---|---|---|---|---|---|---|---|---|---|---|
| | Al plate | Graining treatment | Anodizing treatment | Interface treatment | Image recording layer | Developing process | Al plate cost | Appearance of support | Press life | Scum resistance |
| Example 2-6 | AL1 | 2 | Sulfuric acid anodizing | Undercoating | B-1 | 2 | 88 | ⊚ | 140 | ○ |
| Example 2-7 | AL2 | 2 | Sulfuric acid anodizing | Undercoating | B-1 | 2 | 88 | ⊚ | 140 | ○Δ |
| Example 2-8 | AL3 | 2 | Sulfuric acid anodizing | Undercoating | B-1 | 2 | 93 | ○ | 120 | ○ |
| Example 2-9 | AL4 | 2 | Sulfuric acid anodizing | Undercoating | B-1 | 2 | 98 | ○Δ | 115 | ○ |
| Example 2-10 | AL5 | 2 | Sulfuric acid anodizing | Undercoating | B-1 | 2 | 98 | ○Δ | 110 | ○ |
| Example 2-11 | AL1 | 2 | Sulfuric acid anodizing | Silicate + Undercoating | C-1 | 3 | 88 | ⊚ | 130 | ○ |
| Example 2-12 | AL2 | 2 | Sulfuric acid anodizing | Silicate + Undercoating | C-1 | 3 | 88 | ⊚ | 150 | ○ |
| Example 2-13 | AL3 | 2 | Sulfuric acid anodizing | Silicate + Undercoating | C-1 | 3 | 93 | ○ | 120 | ○ |
| Example 2-14 | AL4 | 2 | Sulfuric acid anodizing | Silicate + Undercoating | C-1 | 3 | 98 | ○Δ | 110 | ○ |
| Example 2-15 | AL5 | 2 | Sulfuric acid anodizing | Silicate + Undercoating | C-1 | 3 | 98 | ○Δ | 100 | ○ |
| Example 2-16 | AL1 | 2 | Sulfuric acid anodizing | Undercoating | C-3 | 4 | 88 | ⊚ | 130 | ○ |
| Example 2-17 | AL2 | 2 | Sulfuric acid anodizing | Undercoating | C-3 | 4 | 88 | ⊚ | 130 | ○Δ |
| Example 2-18 | AL3 | 2 | Sulfuric acid anodizing | Undercoating | C-3 | 4 | 93 | ○ | 115 | ○ |
| Example 2-19 | AL4 | 2 | Sulfuric acid anodizing | Undercoating | C-3 | 4 | 98 | ○Δ | 105 | ○ |
| Example 2-20 | AL5 | 2 | Sulfuric acid anodizing | Undercoating | C-3 | 4 | 98 | ○Δ | 110 | ○ |
| Example 2-21 | AL1 | 2 | Sulfuric acid anodizing | Silicate + Undercoating | D | 1 | 88 | ⊚ | 135 | ○ |
| Example 2-22 | AL2 | 2 | Sulfuric acid anodizing | Silicate + Undercoating | D | 1 | 88 | ⊚ | 155 | ○ |
| Example 2-23 | AL3 | 2 | Sulfuric acid anodizing | Silicate + Undercoating | D | 1 | 93 | ○ | 130 | ○ |
| Example 2-24 | AL4 | 2 | Sulfuric acid anodizing | Silicate + Undercoating | D | 1 | 98 | ○Δ | 115 | ○ |
| Example 2-25 | AL5 | 2 | Sulfuric acid anodizing | Silicate + Undercoating | D | 1 | 98 | ○Δ | 100 | ○ |
| Example 2-26 | AL1 | 2 | Sulfuric acid anodizing | Undercoating | D | 5 | 88 | ⊚ | 138 | ○ |
| Example 2-27 | AL2 | 2 | Sulfuric acid anodizing | Undercoating | D | 5 | 88 | ⊚ | 139 | ○Δ |
| Example 2-28 | AL3 | 2 | Sulfuric acid anodizing | Undercoating | D | 5 | 93 | ○ | 120 | ○ |
| Example 2-29 | AL4 | 2 | Sulfuric acid anodizing | Undercoating | D | 5 | 98 | ○Δ | 110 | ○ |
| Example 2-30 | AL5 | 2 | Sulfuric acid anodizing | Undercoating | D | 5 | 98 | ○Δ | 110 | ○ |
| Example 2-31 | AL1 | 2 | Sulfuric acid anodizing | Silicate + Undercoating | E | 6 | 88 | ⊚ | 130 | ○ |
| Example 2-32 | AL2 | 2 | Sulfuric acid anodizing | Silicate + Undercoating | E | 6 | 88 | ⊚ | 150 | ○ |
| Example 2-33 | AL3 | 2 | Sulfuric acid anodizing | Silicate + Undercoating | E | 6 | 93 | ○ | 120 | ○ |
| Example 2-34 | AL4 | 2 | Sulfuric acid anodizing | Silicate + Undercoating | E | 6 | 98 | ○Δ | 110 | ○ |
| Example 2-35 | AL5 | 2 | Sulfuric acid anodizing | Silicate + Undercoating | E | 6 | 98 | ○Δ | 110 | ○ |
| Example 2-36 | AL1 | 2 | Sulfuric acid anodizing | Silicate + Undercoating | A-2 | 1 | 88 | ⊚ | 140 | ○ |
| Example 2-37 | AL1 | 2 | Sulfuric acid anodizing | Undercoating | A-3 | 5 | 88 | ⊚ | 140 | ○Δ |
| Example 2-38 | AL1 | 2 | Sulfuric acid anodizing | Undercoating | B-2 | 2 | 88 | ⊚ | 130 | ○ |
| Example 2-39 | AL1 | 2 | Sulfuric acid anodizing | Undercoating | C-2 | 3 | 88 | ⊚ | 140 | ○ |
| Comparative Example 2-1 | AL6 | 2 | Sulfuric acid anodizing | Silicate + Undercoating | A-1 | 1 | 100 | ○Δ | 100 | ○ |
| Comparative Example 2-2 | AL6 | 2 | Sulfuric acid anodizing | Undercoating | B-1 | 2 | 100 | ○Δ | 100 | ○ |
| Comparative Example 2-3 | AL6 | 2 | Sulfuric acid anodizing | Silicate + Undercoating | C-1 | 3 | 100 | ○Δ | 100 | ○ |
| Comparative Example 2-4 | AL6 | 2 | Sulfuric acid anodizing | Undercoating | C-3 | 4 | 100 | ○Δ | 100 | ○ |
| Comparative Example 2-5 | AL6 | 2 | Sulfuric acid anodizing | Silicate + Undercoating | D | 1 | 100 | ○Δ | 100 | ○ |
| Comparative Example 2-6 | AL6 | 2 | Sulfuric acid anodizing | Undercoating | D | 5 | 100 | ○Δ | 100 | ○ |
| Comparative Example 2-7 | AL6 | 2 | Sulfuric acid anodizing | Silicate + Undercoating | E | 6 | 100 | ○Δ | 100 | ○ |
| Comparative Example 2-8 | AL7 | 2 | Sulfuric acid anodizing | Silicate + Undercoating | A-1 | 1 | 89 | Δ | 160 | ΔX |
| Comparative Example 2-9 | AL7 | 2 | Sulfuric acid anodizing | Undercoating | B-1 | 2 | 89 | Δ | 140 | ΔX |
| Comparative Example 2-10 | AL7 | 2 | Sulfuric acid anodizing | Silicate + Undercoating | C-1 | 3 | 89 | Δ | 150 | ΔX |
| Comparative Example 2-11 | AL7 | 2 | Sulfuric acid anodizing | Undercoating | C-3 | 4 | 89 | Δ | 130 | ΔX |
| Comparative Example 2-12 | AL7 | 2 | Sulfuric acid anodizing | Silicate + Undercoating | D | 1 | 89 | Δ | 160 | ΔX |
| Comparative Example 2-13 | AL7 | 2 | Sulfuric acid anodizing | Undercoating | D | 5 | 89 | Δ | 145 | ΔX |
| Comparative Example 2-14 | AL7 | 2 | Sulfuric acid anodizing | Silicate + Undercoating | E | 6 | 89 | Δ | 150 | ΔX |

What is claimed is:

1. A support for a lithographic printing plate obtained by subjecting an aluminum plate to a graining treatment and an anodizing treatment, the support comprising:

at least any one of Mn in a range from 0.1 to 1.5 wt % and Mg in a range from 0.1 to 1.5 wt %;

Fe of 0 to 1 wt %;

Si of 0 to 0.5 wt %;

Cu of 0 to 0.2 wt %;

at least one kind of element out of the elements listed in items (a) to (c) below in a range of content affixed thereto, (a) 1 to 100 ppm each of one or more kinds of elements selected from a group consisting of Li, Be, Sc, Mo, Ag, Ge, Ce, Nd, Dy and Au, (b) 0.1 to 10 ppm each of one or more kinds of elements selected from a group consisting of K, Rb, Cs, Sr, Y, Hf, W, Nb, Ta, Tc, Re, Ru, Os, Rh, Ir, Pd, Pt, In, TI, As, Se, Te, Po, Pr, Sm and Tb, and (c) 10 to 500 ppm each of one or more kinds of elements selected from a group consisting of Ba, Co, Cd, Bi and La, and Al and incidental impurities as a remaining portion.

2. The presensitized plate comprising an image recording layer on the support for the lithographic printing plate according to claim 1.

* * * * *